(12) United States Patent
Ide

(10) Patent No.: US 7,382,166 B1
(45) Date of Patent: Jun. 3, 2008

(54) SIGNAL AMPLIFICATION DEVICE

(75) Inventor: Satoshi Ide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 131 days.

(21) Appl. No.: 11/516,785

(22) Filed: Sep. 7, 2006

(30) Foreign Application Priority Data

May 16, 2006 (JP) ............................. 2006-136181

(51) Int. Cl.
*H03K 5/153* (2006.01)
(52) U.S. Cl. ...................... 327/62; 327/58; 327/63; 327/306; 327/307; 330/254; 330/258
(58) Field of Classification Search ............... None
See application file for complete search history.

(56) References Cited

U.S. PATENT DOCUMENTS

| | | | | |
|---|---|---|---|---|
| 4,414,689 A | * | 11/1983 | Enderson | 455/221 |
| 5,539,779 A | * | 7/1996 | Nagahori | 375/317 |
| 5,574,714 A | | 11/1996 | Masashi et al. | 369/124 |
| 5,923,219 A | * | 7/1999 | Ide et al. | 330/308 |
| 6,522,160 B1 | * | 2/2003 | Zivanovic | 324/765 |
| 6,823,025 B2 | * | 11/2004 | Lee et al. | 375/320 |
| 6,828,859 B2 | * | 12/2004 | Dupuis | 330/279 |
| 7,154,289 B2 | * | 12/2006 | Zivanovic | 324/765 |
| 2003/0098805 A1 | * | 5/2003 | Bizjak | 341/139 |
| 2003/0169654 A1 | * | 9/2003 | Hino et al. | 369/44.34 |

OTHER PUBLICATIONS

"A 1.25 Gb/s High Sensitive Peak Detector in Optical Burst-Mode Receiver Using a 0.18μ CMOS Technology", Ja-Won Seo et al., Proceedings of ICCT2003, pp. 644-646.

* cited by examiner

*Primary Examiner*—Tuan T. Lam
*Assistant Examiner*—Hiep Nguyen
(74) *Attorney, Agent, or Firm*—Staas & Halsey LLP

(57) ABSTRACT

A signal amplification device which uses inexpensive standard CMOS and yet is capable of high-accuracy threshold setting. An offset voltage generator detects the direct-current level of an input signal, and generates a positive or negative offset voltage signal. A peak detector outputs, as a peak value, the positive offset voltage signal if the level thereof is higher than the maximum level of the input signal, or the maximum level of the input signal if the maximum level is higher than the positive offset voltage signal. A bottom detector outputs, as a bottom value, the negative offset voltage signal if the level thereof is lower than the minimum level of the input signal, or the minimum level of the input signal if the minimum level is lower than the negative offset voltage signal. A voltage divider subjects the peak and bottom values to voltage division, to generate a threshold level.

21 Claims, 30 Drawing Sheets

SIGNAL AMPLIFICATION DEVICE

CROSS-REFERENCE TO RELATED APPLICATIONS

This application is based upon and claims the benefits of priority from the prior Japanese Patent Application No. 2006-136181, filed on May 16, 2006, the entire contents of which are incorporated herein by reference.

BACKGROUND OF THE INVENTION

1. Field of the Invention

The present invention relates to signal amplification devices, and more particularly, to a signal amplification device for amplifying an input signal by automatically setting a threshold level.

2. Description of the Related Art

High-speed large-capacity broadband optical access networks have been more and more actively constructed to keep up with an explosive increase in data traffic as typified by the Internet. Potential high-speed optical access systems include a G-PON (Gigabit-Passive Optical Network) system which shares an optical fiber network connecting subscribers and a central office and which is capable of high-speed transmission at a maximum data rate of 1 Gbps (physical rate: 1.25 Gbps).

FIG. 22 shows a schematic configuration of a G-PON system. The G-PON system 100 comprises an OLT (Optical Line Terminal) 101, a plurality of ONUs (Optical Network Units) 102-1 to 102-n, and an optical splitter 103.

The OLT 101 and the optical splitter 103 are connected by a single optical fiber, and optical fibers branching off from the optical splitter 103 are connected to the respective ONUs 102-1 to 102-n. The optical splitter 103 carries out 1:n optical splitting/coupling.

In the G-PON system 100, upstream transmission from the ONUs 102-1 to 102-n to the OLT 101 is performed by means of signals with an identical wavelength (1310 nm) sent out from the individual ONUs 102-1 to 102-n. Thus, to prevent collision of optical packets sent from different ONUs, TDMA (Time Division Multiple Access) is employed whereby the transmit timing is controlled according to time division multiplexing.

For the downstream transmission from the OLT 101 to the ONUs 102-1 to 102-n, TDM (Time Division Multiplexing) is adopted in which all ONUs 102-1 to 102-n receive the signal (wavelength: 1490 nm) from the OLT 101 and read out only the information contained in the time slots respectively assigned thereto.

In the case of the upstream transmission, the OLT 101 is synchronized with each of signals transmitted from the ONUs 102-1 to 102-n to receive and regenerate the signals.

For example, where optical packets #1 to #n are transmitted from the respective ONUs 102-1 to 102-n according to TDMA (the optical packets #1 to #n have respective different levels) as shown in FIG. 22, an optical burst-mode receiver 101a is first synchronized with the optical packet #1 to receive same. When receiving the optical packet #2 thereafter, the optical burst-mode receiver 101a is again synchronized with the optical packet #2 to receive same, because the level of the optical packet #2 is different from that of the optical packet #1. The other optical packets are received in like manner.

As conventional signal receiving/regenerating techniques, a technique is known in which the level of an EEM signal read from an optical disk is set to a predetermined level to reproduce data from the EFM signal (e.g., Japanese Patent No. 2889803 (paragraph nos. [0010] to [0015], FIG. 1)).

FIG. 23 shows the transmission format of upstream optical packets. The ONUs 102-1 to 102-n individually output optical packets as a burst, and the optical splitter 103 multiplexes the packets, which are then transmitted to the OLT 101.

In order to absorb timing offsets of the ONUs 102-1 to 102-n, a guard time (signal absence interval) is provided between adjacent optical packets. Also, at the beginning of each optical packet, a preamble is provided for the purpose of synchronization of the optical burst-mode receiver 101a of the OLT 101.

The OLT 101 receives upstream optical packets having such transmission format. When receiving the optical packet #2 after receiving the optical packet #1, for example, the optical burst-mode receiver 101a must be synchronized with the optical packet #2 during the preamble of the optical packet #2 (the guard time interval between the optical packets #1 and #2 is used for the initialization of the optical burst-mode receiver 101a).

During the upstream transmission at 1.25 Gbps, the guard time is, for example, 30 bits (24 ns) and the preamble is about 20 bits (16 ns). Also, the transmission levels of optical packets significantly differ from each other, with the result that the dynamic range becomes as large as 30 dB (1000 times) at the maximum.

It is therefore necessary that the OLT 101 should be synchronized with each of optical packets significantly varying in level depending on individual ONUs, within a short period of the guard time plus the preamble, and quicker response of the OLT 101 has been a principal objective in order to make the G-PON system 100 more practical. Moreover, to bring optical access systems into wide use, it is also necessary that the optical burst-mode receiver 101a should have a simple and cost-effective configuration. Accordingly, the circuitry of the optical burst-mode receiver 101a should desirably be fabricated using low-cost standard CMOS (Complementary Metal Oxide Semiconductor) technology.

Meanwhile, the optical burst-mode receiver 101a includes an automatic threshold circuit (ATC) therein. The auto threshold circuit is adapted to automatically set the threshold level to a median between the levels "1" and "0" of an input signal, to enable instantaneous signal discrimination (equivalent to the aforementioned synchronization with an optical packet). The auto threshold circuit comprises, as its principal components, a peak detector for detecting the level "1", a bottom detector for detecting the level "0", and a voltage divider for setting the threshold to a median level between the levels "0" and "1".

FIG. 24 shows a schematic configuration of the peak detector. The peak detector 110, which is an element constituting the automatic threshold circuit, includes an amplifier 111, an N-channel MOS-FET (Metal Oxide Semiconductor-Field Effect Transistor) 112, a buffer 113, and a capacitor C3.

The amplifier 111 has an input terminal (+) supplied with an electrical signal obtained by subjecting an optical packet to O/E conversion, and has the other input terminal (−) connected to the output terminal of the buffer 113. The output terminal of the amplifier 111 is connected to the drain and gate of the FET 112, of which the source is connected to one end of the capacitor C3 as well as to the input terminal of the buffer 113. The other end of the capacitor C3 is connected to GND (grounded). The FET 112 serves to rectify the output waveform of the amplifier 111 and plays a role equivalent to a diode; therefore, the FET is hereinafter referred to as FET diode 112.

FIG. 25 shows an ideal output waveform of the peak detector 110, wherein the horizontal axis indicates time and the vertical axis indicates voltage. When the voltage of the input signal varies on the positive side from the level "0" as a reference, the FET diode 112 conducts, charging the capacitor C3 so as to hold the maximum value of the input signal. If, in the circuit of FIG. 24, Vin drops to a level lower than Vout, the amplifier 111 outputs a negative voltage Va of large magnitude, so that the FET diode 112 is reversely biased. However, since Vout is held by the charge voltage of the capacitor C3, the output Vout is maintained and follows the maximum value (peak value) of the input Vin.

In cases where the peak detector 110 is used in a system adapted to receive signals at a high, Gbps-order data rate, such as a G-PON system, a problem arises in that it is difficult to detect peaks with high accuracy. The following explains the problems associated with the conventional peak detector 110 (e.g., a problem with the peak detector 110 that arises when the input signal varies toward the level "1" side from the level "0" as a reference).

Let us consider the amplifier 111 first. The performance of the amplifier 111 depends upon the frequency range and voltage range of the input signal. If the performance of the amplifier 111 is not up to properly handling the input signal, an error (detection error) is caused between an actual peak of the input signal and the peak detected by the peak detector 110.

FIG. 26 shows such a peak detection error, wherein the horizontal axis indicates time and the vertical axis indicates voltage. Let us suppose the case where the input signal has a waveform alternating in a high data rate and also has a small amplitude. In this case, if the frequency bandwidth of the input signal is higher than the frequency bandwidth that can be processed by the amplifier 111 and also if the gain of the amplifier 111 is insufficient, an error Δ is caused between an actual peak P1 of the input signal and a peak level P2 detected by the peak detector 110, for the reason explained below.

The amplifier 111 is a differential amplifier; therefore, the amplifier 111 amplifies a differential level corresponding to the error Δ between the actual peak P1 and the detected peak P2 and outputs a signal (hereinafter referred to as signal d1) having a waveform with a smaller amplitude than that of the input signal. If such signal d1 is output from the amplifier 111, the FET diode 112 fails to be applied with a sufficiently high voltage needed for operation.

FIG. 27 exemplifies the relationship between drain current and gate-source voltage, or the characteristic of the FET diode 112, wherein the horizontal axis indicates the drain current (A) and the vertical axis indicates the gate-source voltage (V). As seen from FIG. 27, as the gate-source voltage lowers, the drain current approaches "0".

FIG. 28 exemplifies the relationship between drain current and differential resistance, wherein the horizontal axis indicates the drain current (mA) and the vertical axis indicates the differential resistance (Ω). As illustrated, the smaller the drain current of the FET diode 112, the greater the differential resistance becomes.

FIG. 29 shows the relationship between drain current and cut-off frequency, wherein the horizontal axis indicates the drain current (mA) and the vertical axis indicates the cut-off frequency (Hz) (where the capacitance is, e.g., 1 pF). The figure reveals that as the drain current of the FET diode 112 decreases, the cut-off frequency of the device constituted by the FET diode 112 and the capacitor C3 lowers due to increase of the differential resistance, which entails a shortage of bandwidth.

Thus, even if an amplifier with high slew rate and wide frequency bandwidth is used for the amplifier 111 in order to restrain narrowing of the bandwidth, the FET diode 112 and the capacitor C3, which are passive elements unsuited for quick response to a weak input signal with a small amplitude, are arranged in the stage succeeding the amplifier 111. Accordingly, the passive elements eventually become a bottleneck and narrow the bandwidth, giving rise to the problem that the peak voltage detection accuracy lowers.

If the peak detection accuracy of the OLT 101 is not high, then it is impossible to accurately set the threshold to the median level of the received signal.

Namely, the threshold cannot be set at the center of the eye pattern, with the result that codes may possibly be recognized in error (e.g., "1" may possibly be mistaken for "0"), which lowers reliability.

Further, in cases where the input signal begins to show a continuously high waveform subsequently to an alternating waveform, the peak detection error decreases to a small level upon start of the continuously high waveform, compared with that caused during the alternating waveform interval, posing the problem that the threshold varies even though the input signal being received is of the same level.

FIG. 30 shows such variation of the threshold caused when the input signal begins to show a continuously high waveform subsequently to an alternating waveform, wherein the horizontal axis indicates time and the vertical axis indicates voltage. While the input signal shows an alternating waveform in a high data rate, narrowing of the bandwidth takes place in the peak detector 110, causing the peak detection error Δ shown in FIG. 26. As the input signal begins to show a continuously high waveform thereafter, the frequency bandwidth of the input signal becomes lower than the cut-off frequency of the device constituted by the FET diode 112 and the capacitor C3, whereby the peak detector can follow up the peak of the input signal and output a nearly accurate peak value.

This means that the threshold varies during the reception of one optical packet. If the threshold varies, erroneous recognition of codes may possibly take place in a manner such that, for example, before the variation of the threshold, a certain code is recognized as "1", but after the threshold variation, the same code is recognized as "0", lowering the reliability of the code reproduction by the OLT 101.

SUMMARY OF THE INVENTION

The present invention was created in view of the above circumstances, and an object thereof is to provide a signal amplification device which uses inexpensive standard CMOS, instead of expensive high-speed IC, and yet is capable of high-accuracy threshold setting.

To achieve the object, there is provided a signal amplification device for amplifying an input signal by automatically setting a threshold level. The signal amplification device comprises an offset voltage generator, a threshold controller, and an amplifier. The offset voltage generator detects a direct-current level of the input signal, and generates and outputs a positive offset voltage signal or a negative offset voltage signal. The threshold controller includes a peak detector for outputting the positive offset voltage signal as a peak value if a level of the positive offset voltage signal is higher than a maximum level of the input signal, and outputting the maximum level of the input signal as the peak value if the maximum level of the input signal is higher than the level of the positive offset voltage signal, a bottom detector for outputting the negative offset voltage signal as a bottom value if a level of the negative offset voltage signal is lower than a minimum level of the input signal, and outputting the minimum level of the input signal as the bottom value if the minimum level of the input signal is lower than the level of the negative offset voltage signal, and a voltage divider for subjecting the peak value output from the peak detector and the bottom value output from the bottom detector to voltage division, to generate the threshold level. The amplifier amplifies a differential between the input signal and the threshold level output from the voltage divider.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
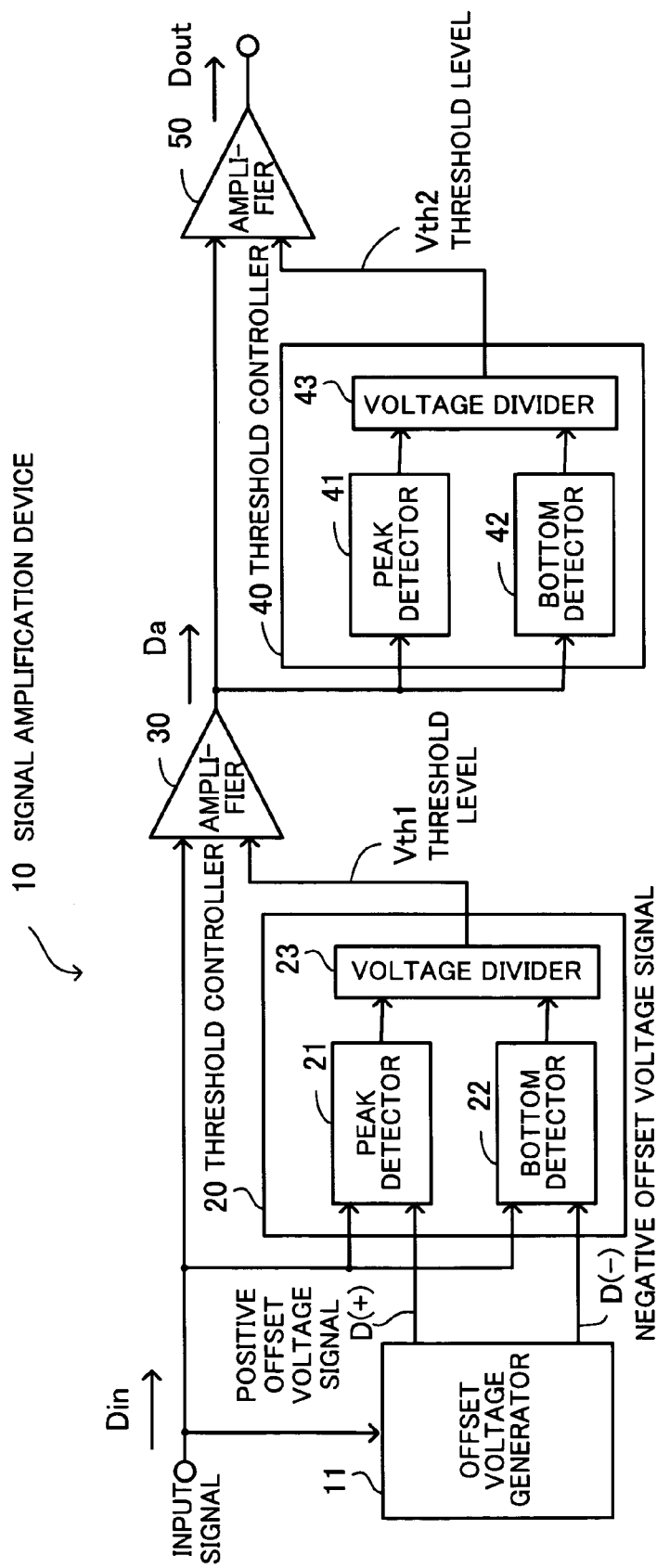
FIG. 1 illustrates the principle of a signal amplification device.

Preferred embodiments of the present invention will be described below with reference to the accompanying drawings, wherein like reference numerals refer to like elements throughout. FIG. 1 illustrates the principle of a signal amplification device. The signal amplification device 10 is a device for amplifying an input signal by automatically setting a threshold level and comprises an offset voltage generator 11, a first threshold controller (threshold controller 20), a first amplifier (amplifier 30), a second threshold controller (threshold controller 40), and a second amplifier (amplifier 50).

The offset voltage generator 11 detects a direct-current (DC) level of the input signal Din and adds a preset positive offset voltage Voff(+) to the detected direct-current level, to generate a positive offset voltage signal D(+). Also, by adding a preset negative offset voltage Voff(−) to the detected direct-current level, the offset voltage generator 11 generates a negative offset voltage signal D(−).

The threshold controller 20 includes a first peak detector (peak detector 21), a first bottom detector (bottom detector 22), and a first voltage divider (voltage divider 23). The peak detector 21 is input with the positive offset voltage signal D(+) and the input signal Din and, if the level of the positive offset voltage signal D(+) is higher than a maximum level of the input signal Din, outputs the level of the positive offset voltage signal D(+) as a peak value.

If the maximum level of the input signal Din is higher than the level of the positive offset voltage signal D(+), the peak detector outputs the maximum level of the input signal Din as the peak value (the peak of the input signal Din is normally detected).

The bottom detector 22 is input with the negative offset voltage signal D(−) and the input signal Din and, if the level of the negative offset voltage signal D(−) is lower than a minimum level of the input signal Din, outputs the level of the negative offset voltage signal D(−) as a bottom value.

If the minimum level of the input signal Din is lower than the level of the negative offset voltage signal D(−), the bottom detector outputs the minimum level of the input signal Din as the bottom value (the bottom of the input signal Din is normally detected).

The voltage divider 23 subjects the peak value output from the peak detector 21 and the bottom value output from the bottom detector 22 to voltage division, to generate a first threshold level (threshold level Vth1). The amplifier 30 amplifies a differential between the input signal Din and the threshold level Vth1 output from the voltage divider 23 and outputs an amplified signal Da.

The threshold controller 40 includes a second peak detector (peak detector 41), a second bottom detector (bottom detector 42), and a second voltage divider (voltage divider 43). The peak detector 41 detects a peak value of the amplified signal Da, and the bottom detector 42 detects a bottom value of the amplified signal Da.

The voltage divider 43 subjects the peak value output from the peak detector 41 and the bottom value output from the bottom detector 42 to voltage division, to generate a second threshold level (threshold level Vth2). The amplifier 50 amplifies a differential between the amplified signal Da and the threshold level Vth2 output from the voltage divider 43, to generate an output signal Dout.

Figure 2:
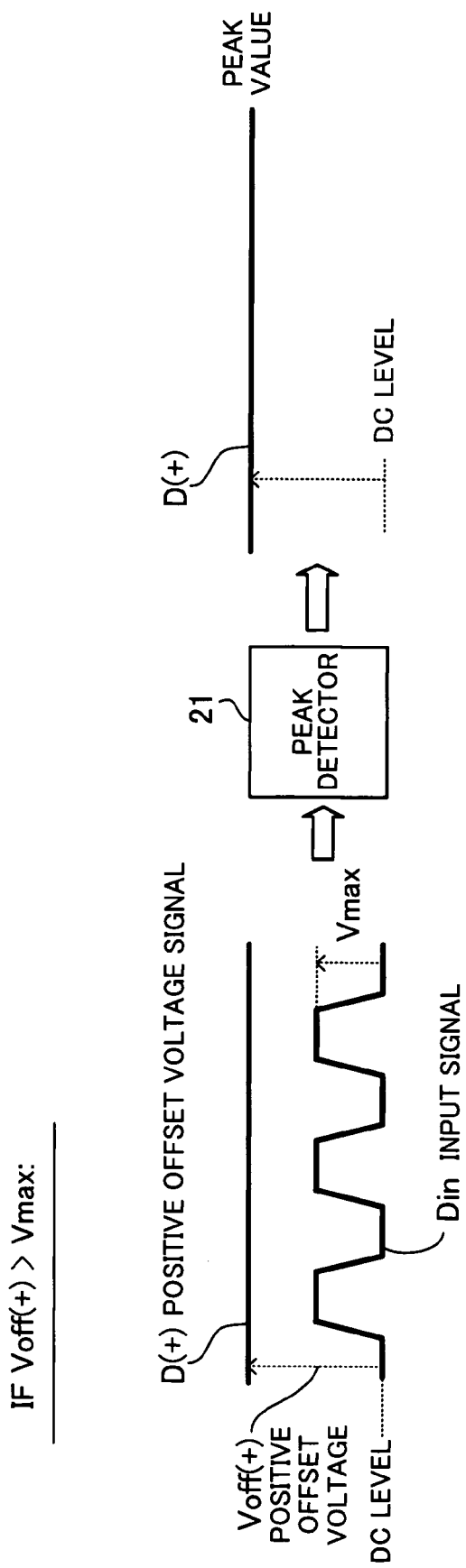
FIG. 2 schematically illustrates the operation of a peak detector.
Figure 3:
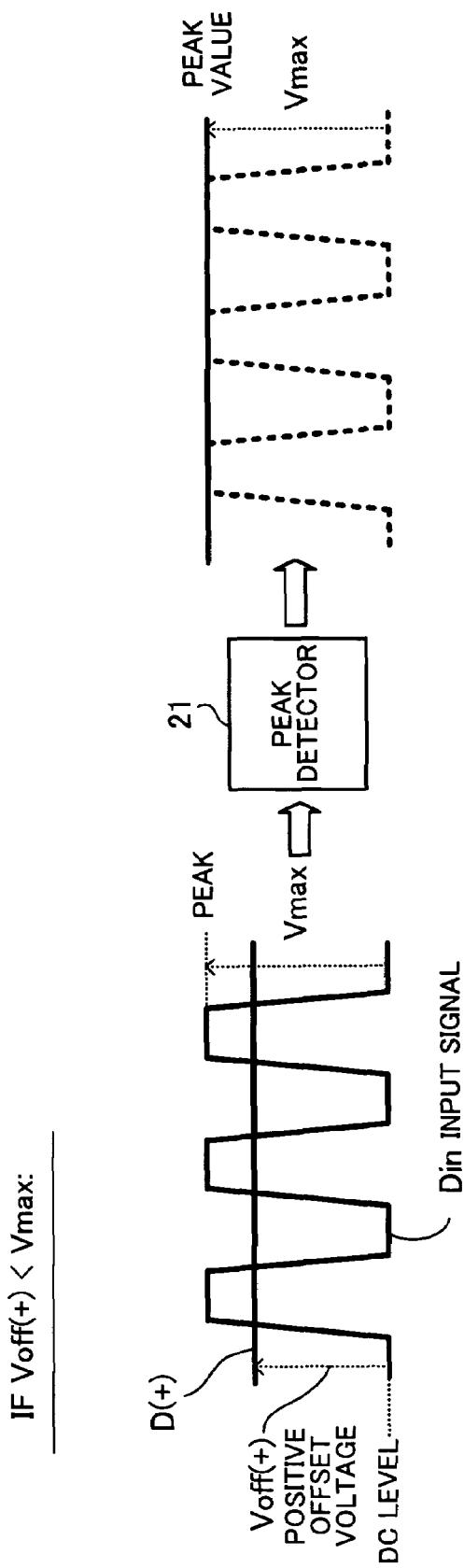
FIG. 3 also schematically illustrates the operation of the peak detector.

FIGS. 2 and 3 schematically illustrate the operation of the peak detector 21. The peak detector 21 is input with the positive offset voltage signal D(+), which is output from the offset voltage generator 11, as well as with the input signal Din.

Let it be assumed here that the input signal Din has a maximum level Vmax and that the preset positive offset voltage is Voff(+). If Voff(+)>Vmax as shown in FIG. 2, the peak detector 21 outputs, as the peak value, a level equal to that of the positive offset voltage signal D(+) (the positive offset voltage signal D(+) is detected as the peak).

On the other hand, if Voff(+)<Vmax as shown in FIG. 3, the peak detector 21 detects the peak of the input signal Din and outputs the maximum level Vmax of the input signal Din as the peak value.

Namely, in cases where the input signal Din has a small amplitude, the circuit elements in the peak detector 21 may possibly cause narrowing of the bandwidth with respect to variation of the input signal Din on the positive side. According to the aforementioned operation, when the amplitude of the input signal Din is so small as to induce narrowing of the bandwidth, the peak of the input signal Din is not detected, and when the amplitude of the input signal Din is so large that narrowing of the bandwidth does not take place with respect to the positive variation, the peak of the input signal Din is normally detected.

Figure 4:
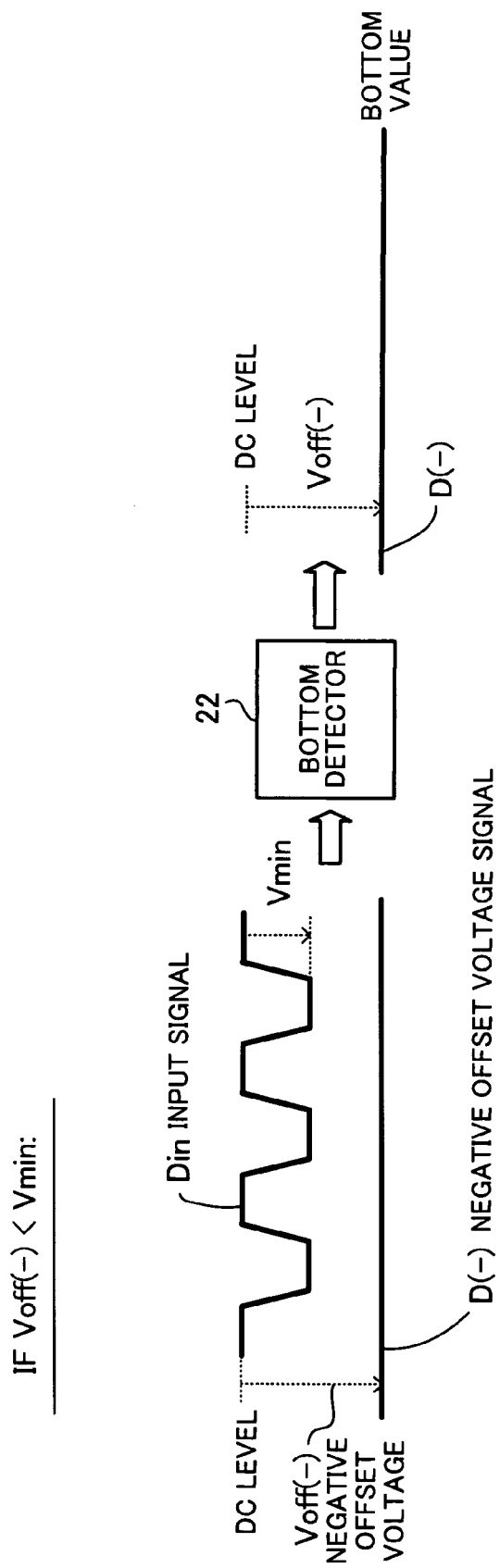
FIG. 4 schematically illustrates the operation of a bottom detector.
Figure 5:
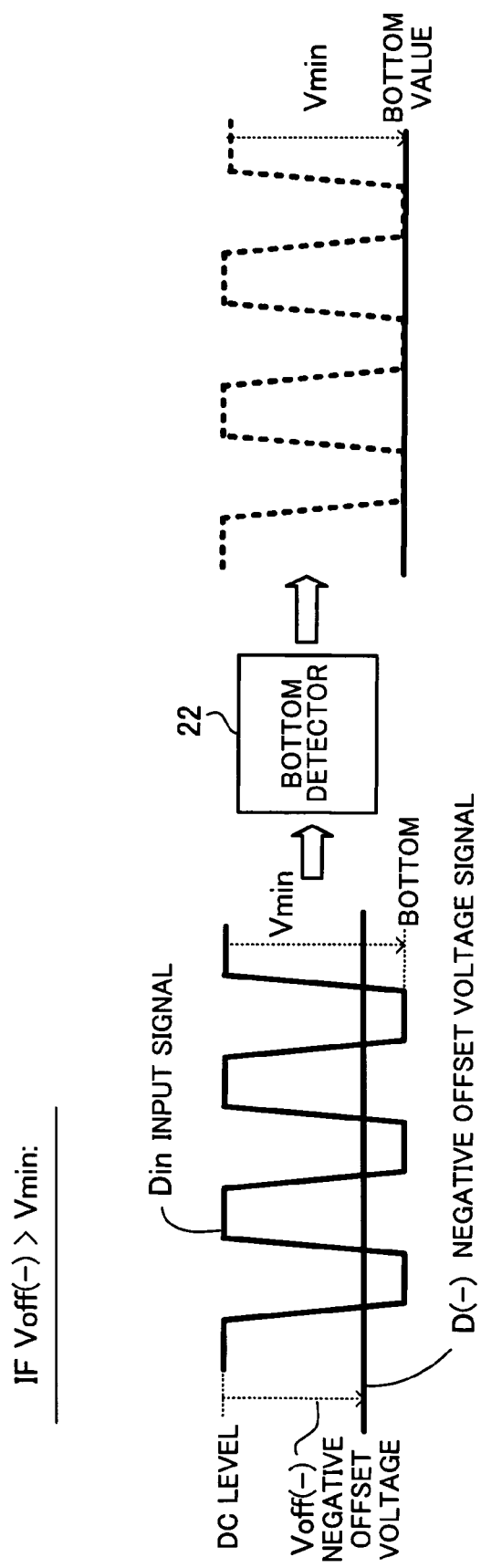
FIG. 5 also schematically illustrates the operation of the bottom detector.

FIGS. 4 and 5 schematically illustrate the operation of the bottom detector 22. The bottom detector 22 is input with the negative offset voltage signal D(−), which is output from the offset voltage generator 11, as well as with the input signal Din.

Let it be assumed here that the input signal Din has a minimum level Vmin and that the preset negative offset voltage is Voff(−), as shown in FIG. 4. If Voff(−)<Vmin (if the input signal Din has a small amplitude such that its variation on the negative side is smaller than the negative offset voltage Voff(−)), the bottom detector 22 outputs, as the bottom value, a level equal to that of the negative offset voltage signal D(−) (the negative offset voltage signal D(−) is detected as the bottom).

On the other hand, if Voff(−)>Vmin (if the input signal Din has a large amplitude such that its negative variation is greater than the negative offset voltage Voff(−)), as shown in FIG. 5, the bottom detector 22 detects the bottom of the input signal Din and outputs the minimum level Vmin of the input signal Din as the bottom value.

Namely, in cases where the input signal Din has a small amplitude, the circuit elements in the bottom detector 22 may possibly cause narrowing of the bandwidth with respect to variation of the input signal Din on the negative side. According to the aforementioned operation, when the amplitude of the input signal Din is so small as to induce narrowing of the bandwidth, the bottom of the input signal Din is not detected, and when the amplitude of the input signal Din is so large that narrowing of the bandwidth does not take place with respect to the negative variation, the bottom of the input signal Din is normally detected.

Figure 6:
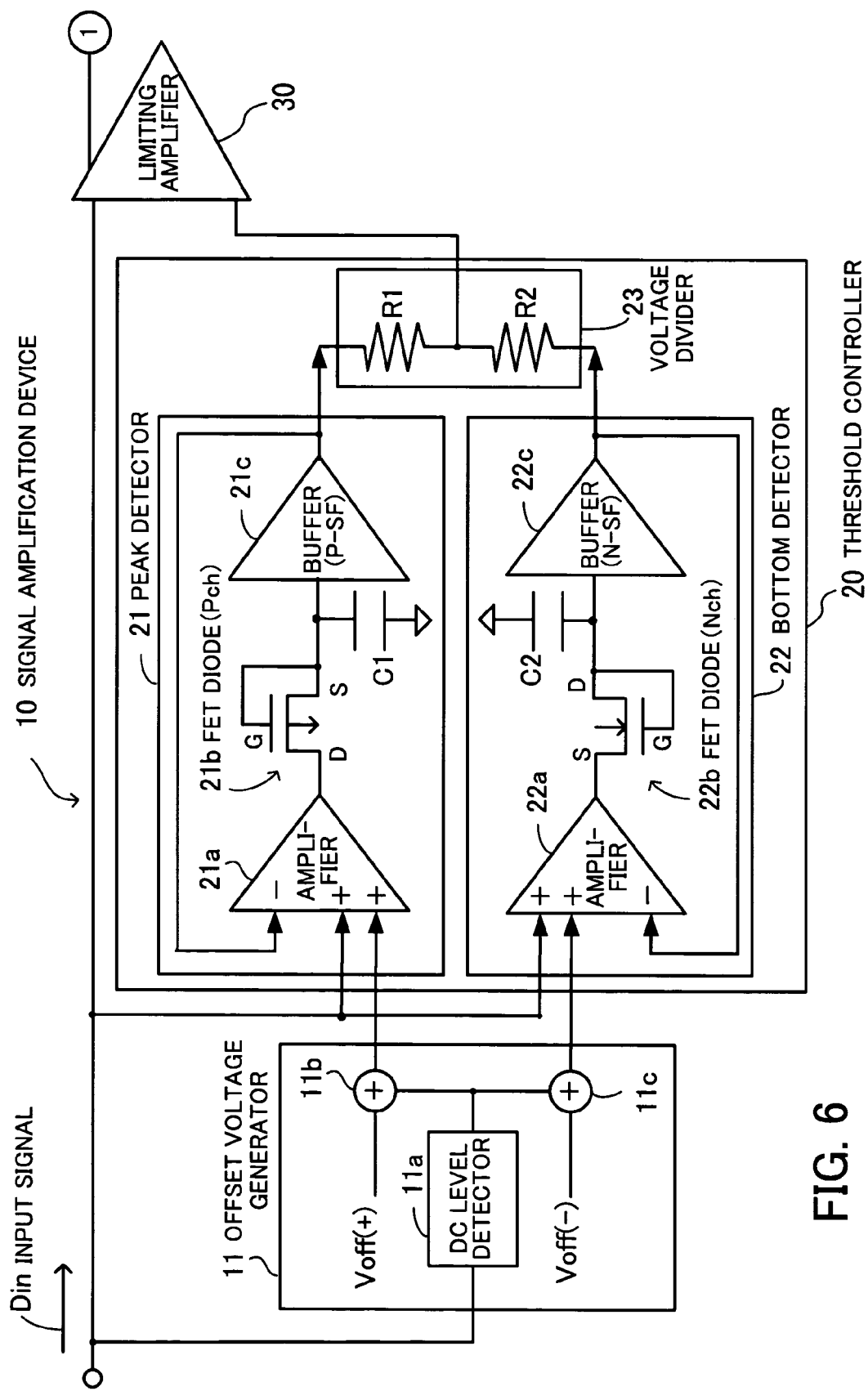
FIG. 6 shows the circuit configuration of the signal amplification device.
Figure 7:
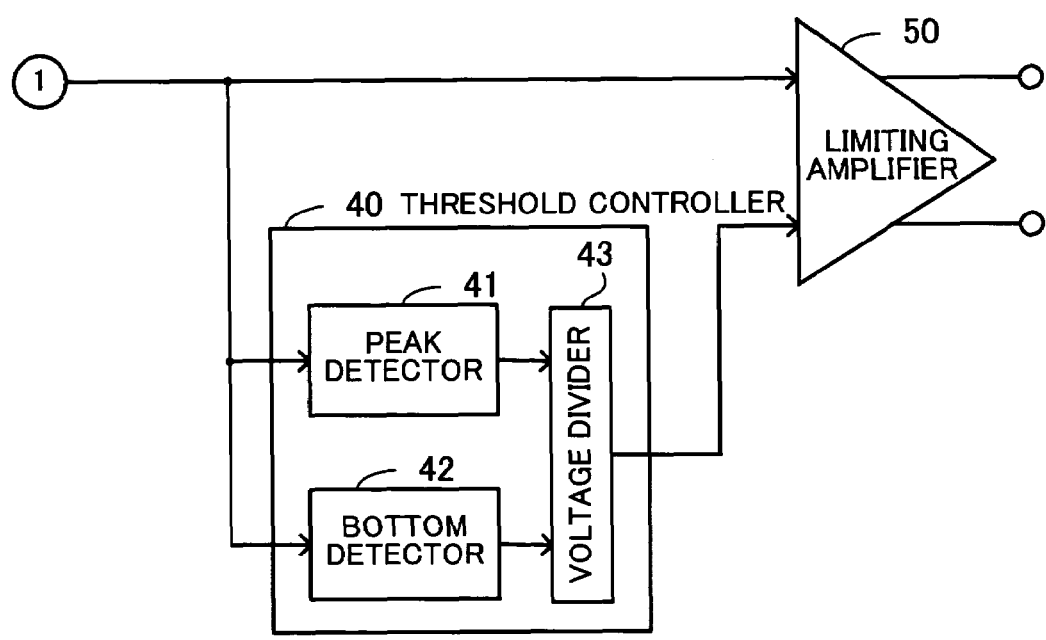
FIG. 7 also shows the circuit configuration of the signal amplification device.

The circuit configuration and operation of the signal amplification device 10 will be now described in detail. FIGS. 6 and 7 show the circuit configuration of the signal amplification device 10. The signal amplification device 10 comprises the offset voltage generator 11, the threshold controller 20, a limiting amplifier (amplifier) 30, the threshold controller 40, and a limiting amplifier (amplifier) 50.

The offset voltage generator 11 includes a direct-current (DC) level detector 11*a* and adders 11*b* and 11*c*. The threshold controller 20 includes the peak detector 21, the bottom detector 22, and the voltage divider 23.

The peak detector 21 is constituted by an amplifier 21*a*, a P-channel MOS-FET 21*b* (hereinafter FET diode 21*b*), a buffer 21*c*, and a capacitor C1. The bottom detector 22 is constituted by an amplifier 22*a*, an N-channel MOS-FET 22*b* (hereinafter FET diode 22*b*), a buffer 22*c*, and a capacitor C2. The voltage divider 23 is constituted by resistors R1 and R2.

The threshold controller 40 includes the peak detector 41, the bottom detector 42, and the voltage divider 43. The threshold controller 40 has a circuit configuration identical with that of the threshold controller 20 except that it is not input with the offset voltage signals, and therefore, internal arrangement thereof is not illustrated.

The circuit elements of the offset voltage generator 11 and those of the threshold controller 20 are connected in the manner described below. The input signal Din is input to the DC level detector 11*a*. The adder 11*b* adds the positive offset voltage Voff(+) and the output of the DC level detector 11*a*, and the adder 11*c* adds the negative offset voltage Voff(−) and the output of the DC level detector 11*a*.

The amplifier 21*a* has an input terminal (−) to which the output of the buffer 21*c* is fed back. Also, the amplifier 21*a* has an input terminal (+) supplied with the input signal Din, and has the other input terminal (+) supplied with the output of the adder 11*b*.

The output terminal of the amplifier 21*a* is connected to the source of the FET diode 21*b*, of which the drain is connected to the gate, one end of the capacitor C1 and the input terminal of the buffer 21*c*. The other end of the capacitor C1 is connected to GND (grounded). The output terminal of the buffer 21*c* is connected to the input terminal (−) of the amplifier 21*a* as well as to one end of the resistor R1 of the voltage divider 23.

The amplifier 22*a* has an input terminal (−) to which the output of the buffer 22*c* is fed back. Also, the amplifier 22*a* has an input terminal (+) supplied with the input signal Din, and has the other input terminal (+) supplied with the output of the adder 11*c*.

The output terminal of the amplifier 22*a* is connected to the source of the FET diode 22*b*, of which the drain is connected to the gate, one end of the capacitor C2 and the input terminal of the buffer 22*c*. The other end of the capacitor C2 is connected to GND. The output terminal of the buffer 22*c* is connected to the input terminal (−) of the amplifier 22*a* as well as to one end of the resistor R2 of the voltage divider 23. The limiting amplifier 30 has one input terminal supplied with the input signal Din, and has the other input terminal connected to the other ends of the resistors R1 and R2 of the voltage divider 23.

Figure 8:
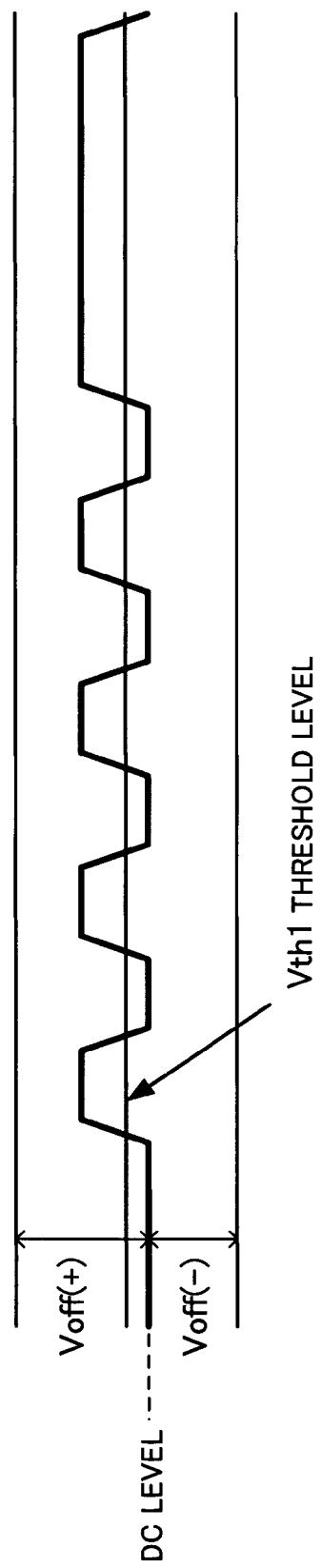
FIG. 8 shows a waveform response where a small signal is input as an input signal.

FIG. 8 shows a waveform response where the input signal Din is a small signal. In cases where the amplitude of the input signal Din is so small that narrowing of the bandwidth is caused by at least one of the amplifier 21*a* and the FET diode 21*b* with respect to positive variation of the input signal Din (where the amplitude of the input signal Din is smaller than the positive offset voltage Voff(+)), the input signal Din is not used for the peak detection or the threshold setting.

In such cases, the positive offset voltage signal D(+), which is obtained by adding the preset positive offset voltage Voff(+) to the DC level of the input signal Din detected by the DC level detector 11a, is output from the peak detector 21. Also, the negative offset voltage signal D(−), which is obtained by adding the preset negative offset voltage Voff(−) to the DC level of the input signal Din, is output from the bottom detector 22. The voltage divider 23 outputs, as the threshold level Vth1, a level derived by dividing the potential difference between the offset voltage signals in the resistance ratio.

Figure 9:
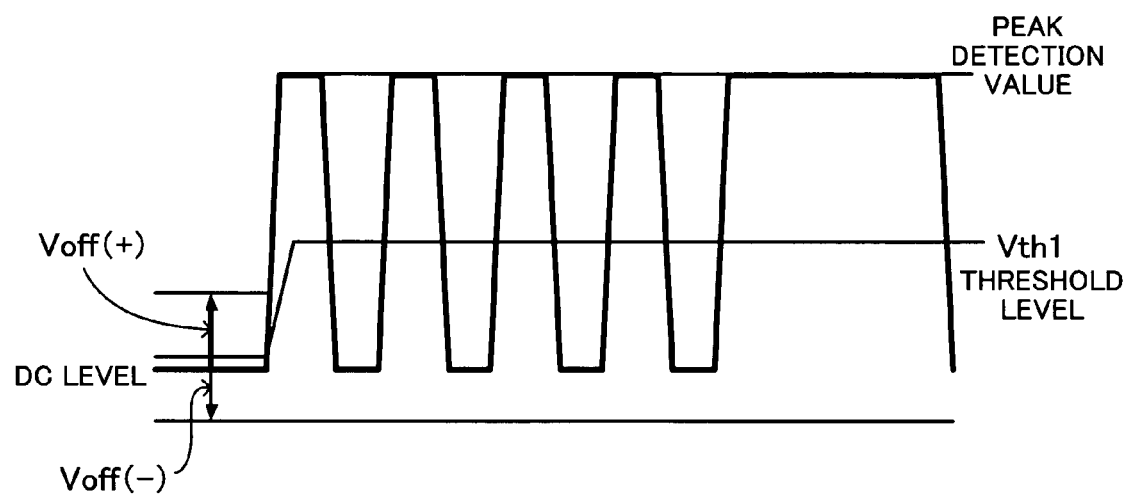
FIG. 9 shows a waveform response where the input signal is a large signal.

FIG. 9 shows a waveform response where the input signal Din is a large signal. In cases where the amplitude of the input signal Din is so large that narrowing of the bandwidth is not caused by the amplifier 21a or the FET diode 21b with respect to positive variation of the input signal Din (where the amplitude of the input signal Din is larger than the positive offset voltage Voff(+)), the peak detection and the threshold setting are carried out normally by using the input signal Din.

Specifically, the peak detector 21 detects and outputs the peak value of the input signal Din, while the bottom detector 22 detects and outputs the bottom value of the input signal Din. The voltage divider 23 outputs, as the threshold level Vth1, a level derived by dividing the potential difference between the peak and bottom values in the resistance ratio.

The input signal Din and the threshold level Vth1 generated by the threshold controller 20 are input to the limiting amplifier 30, which then amplifies the differential between the signals input thereto and outputs the resultant signal.

In the threshold controller 40, the peak detector 41 detects the peak value of the amplified signal Da output from the limiting amplifier 30, and the bottom detector 42 detects the bottom value of the amplified signal Da. The voltage divider 43 outputs, as the threshold level Vth2, a level derived by dividing the potential difference between the detected peak and bottom values in the resistance ratio. The limiting amplifier 50 amplifies the differential between the amplified signal Da and the threshold level Vth2 and outputs the resultant signal.

As explained above, in the case where the amplitude of the input signal Din is so small that the circuit elements are incapable of quick response to the input signal, the threshold level is set using the fixed offset voltages by means of the offset voltage generator 11 and the threshold controller 20, and where the amplitude is so large that the offset voltages are exceeded, the threshold level is set normally. Consequently, even if the input signal Din is such a small signal that the circuit elements are incapable of quick response to the input signal, it is possible to restrain narrowing of the bandwidth and thus to prevent erroneous operation.

Also, as stated above with reference to FIGS. 6 and 7, after the threshold level is set by the threshold controller 20, the difference between the set threshold level and the input signal is linearly amplified. Then, in the threshold controller 40, the peak and bottom values of the linearly amplified signal are detected by peak detector 41 and bottom detector 42 to set again the threshold level. This makes it possible to cancel out error in the threshold level set in the threshold controller 20 by using the offset voltages, thereby improving the accuracy in the threshold setting.

Figure 10:
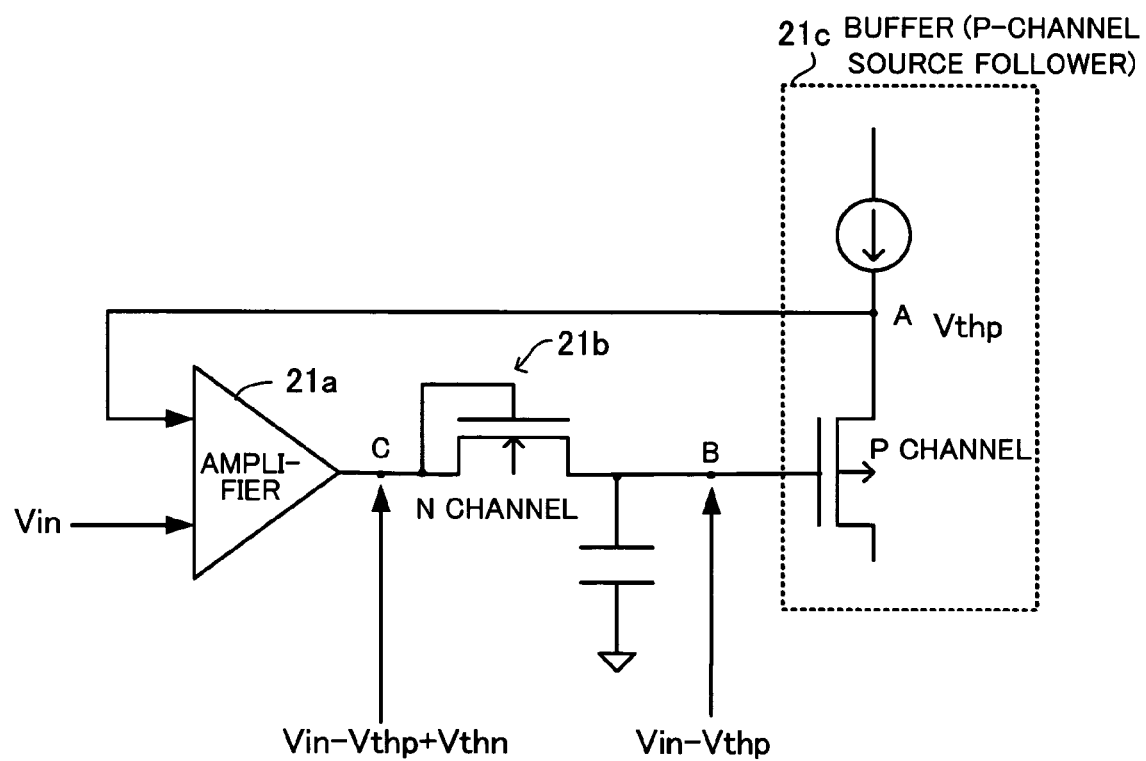
FIG. 10 illustrates the reason why the operating point of an amplifier is shifted.

The following explains a problem caused due to shifting of the operating points of the amplifiers 21a and 22a and a solution to the problem. FIG. 10 is a schematic diagram illustrating the reason why the operating point of the amplifier 21a is shifted. Since the figure is given for the sole purpose of explaining the problem, description of the connections of the individual elements is omitted.

In the illustrated peak detector 21, a P-channel source follower is used as the buffer 21c, and an N-channel FET as the FET diode 21b. Provided the input voltage to the amplifier 21a is Vin, the voltage at point A is nearly equal to Vin, and the voltage at point B is Vin−Vthp, because the voltage drops by an amount corresponding to the bias voltage Vthp of the P-channel source follower. The voltage at point C is higher than the voltage at point B by an amount corresponding to the voltage drop Vthn of the N-channel FET diode and therefore, Vin−Vthp+Vthn (the explanation is given here only roughly because the aim is to clarify the problem).

The voltage at point C, which is the output point of the amplifier 21a, involves Vthn and Vthp, indicating that the voltage is influenced by both Vthn of the FET diode 21b and Vthp of the buffer 21c. The value (−Vthp+Vthn) is, for example, ±0.3 V or thereabout with respect to Vin−Vthp+Vthn, and this means that, at the output point of the amplifier 21a, the operating point shifts by about 0.6 V. In cases where the circuitry is constructed using high-speed CMOS, a 0.6-V shift of the operating point with respect to the supply voltage of, for example, 1.8 V significantly degrades the characteristics of the circuitry, making accurate peak detection impossible.

The embodiment shown in FIG. 6 is characterized in that the polarity of the FET diode 21b is made to be identical with that of the buffer 21c, in order to restrain such shifting of the operating point. Specifically, a P-channel FET is used for the FET diode 21b, whereby the voltage at point C becomes Vin−Vthp+Vthp=Vin and thus is prevented from being influenced by Vthn of the FET diode 21b or Vthp of the buffer 21c, making it possible to restrain shifting of the operating point.

Figure 11:
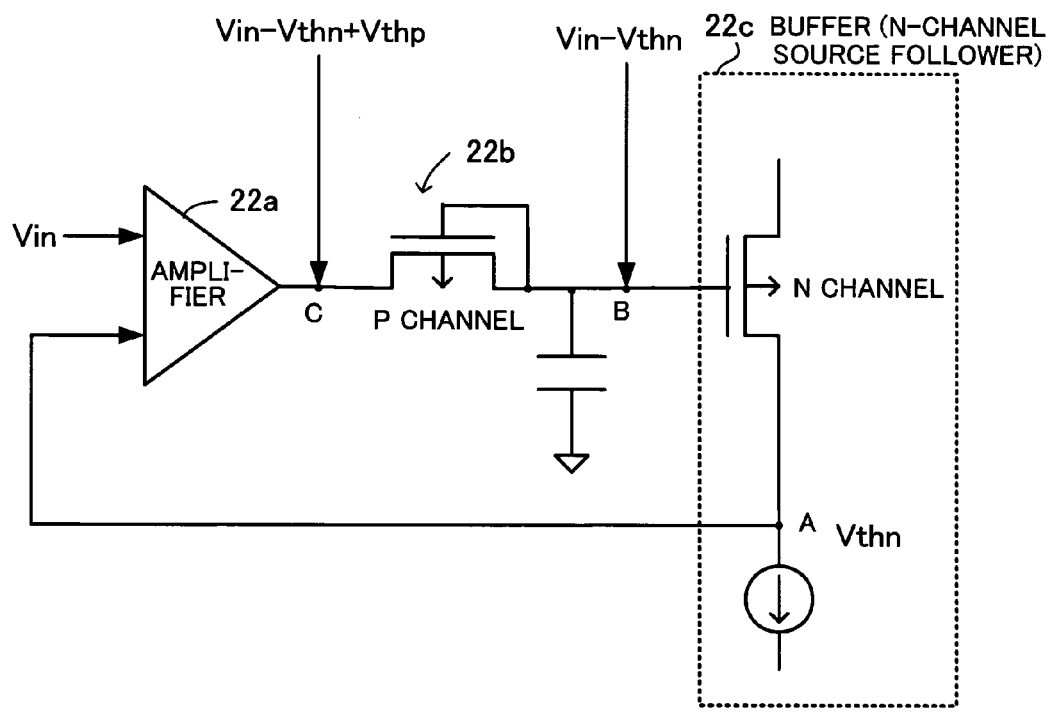
FIG. 11 also illustrates the reason why the operating point of an amplifier is shifted.

Referring now to FIG. 11, the reason why the operating point of the amplifier 22a is shifted will be explained in the same manner as in FIG. 10. In the illustrated bottom detector 22, an N-channel source follower is used as the buffer 22c, and a P-channel FET diode as the FET diode 22b. Provided the input voltage to the amplifier 22a is Vin, the voltage at point A is nearly equal to Vin, and the voltage at point B is Vin−Vthn, because the voltage drops by an amount corresponding to the bias voltage Vthn of the N-channel source follower. The voltage at point C is higher than the voltage at point B by an amount corresponding to the voltage drop Vthp of the P-channel FET, and therefore, Vin−Vthn+Vthp (the explanation is given here only roughly because the aim is to clarify the problem).

The voltage at point C, which is the output point of the amplifier 22a, involves Vthn and Vthp, revealing that the voltage is influenced by both Vthp of the FET diode 22b and Vthn of the buffer 22c. The value (−Vthn+Vthp) is, for example, ±0.3 V or thereabout with respect to Vin−Vthn+Vthp, and this means that, at the output point of the amplifier 22a, the operating point shifts by about 0.6 V. In cases where the circuitry is constructed using high-speed CMOS, a 0.6-V shift of the operating point with respect to the supply voltage of, for example, 1.8 V significantly degrades the characteristics of the circuitry, making accurate bottom detection impossible.

The embodiment of FIG. 6 is characterized in that the polarity of the FET diode 22b is made to be identical with that of the buffer 22c, in order to restrain such shifting of the operating point. Specifically, an N-channel FET is used for the FET diode 22b, whereby the voltage at point C becomes Vin−Vthn+Vthn=Vin and thus is prevented from being influenced by Vthp of the FET diode 22b or Vthn of the buffer 22c, making it possible to restrain shifting of the operating point.

In the peak detector 21 shown in FIG. 6, the buffer 21c and the FET diode 21b are constituted by a P-channel source follower and a P-channel MOS-FET, respectively, and thus are constituted by FETs of the same polarity. In the bottom detector 22, where an N-channel source follower is used for the buffer 22c, an N-channel MOS-FET is used for the FET diode 22b so that the buffer and the FET diode may be constituted by FETs of the same polarity.

Figure 12:
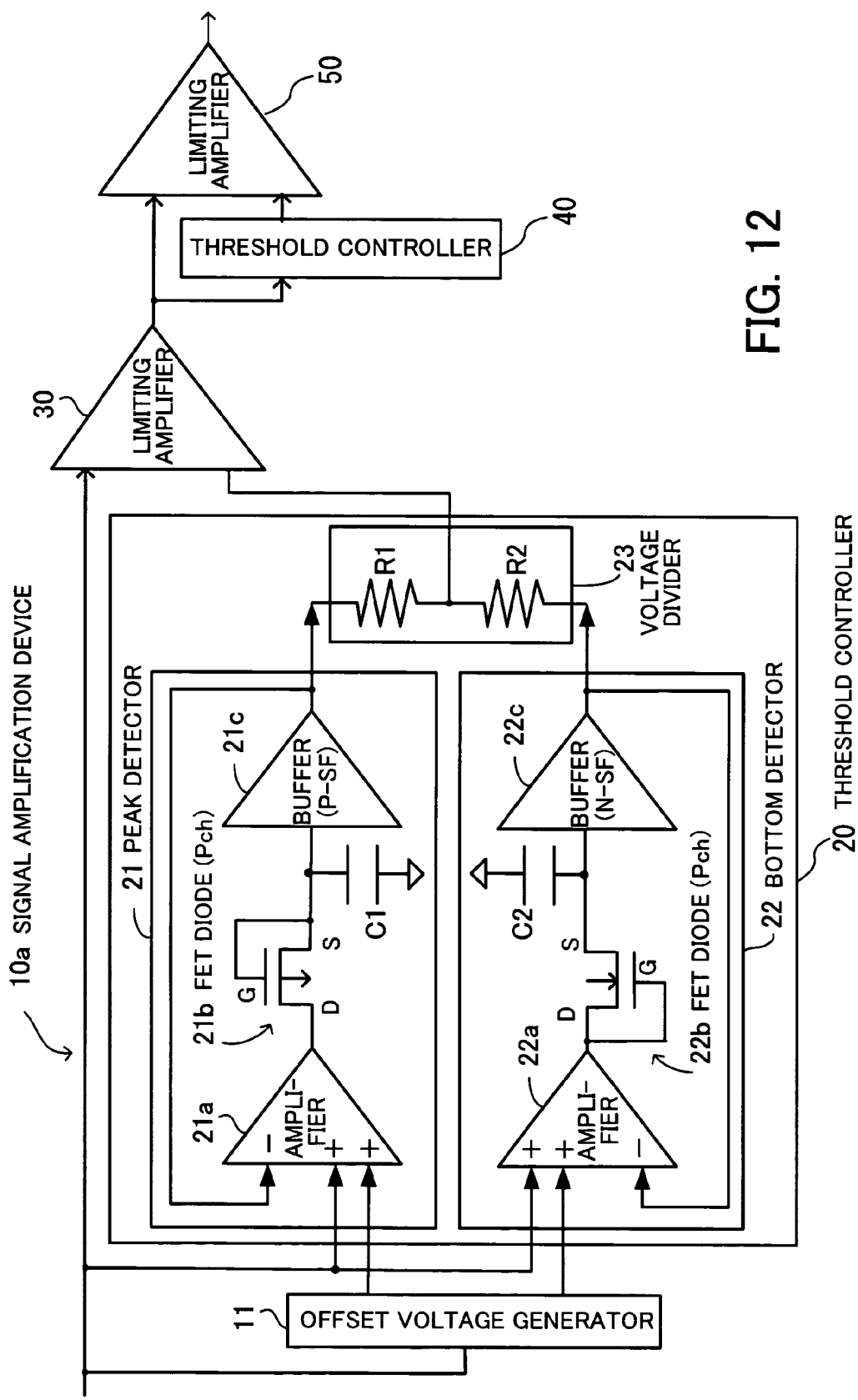
FIG. 12 shows the configuration of a signal amplification device whose peak detector is of an identical polarity type.
Figure 13:
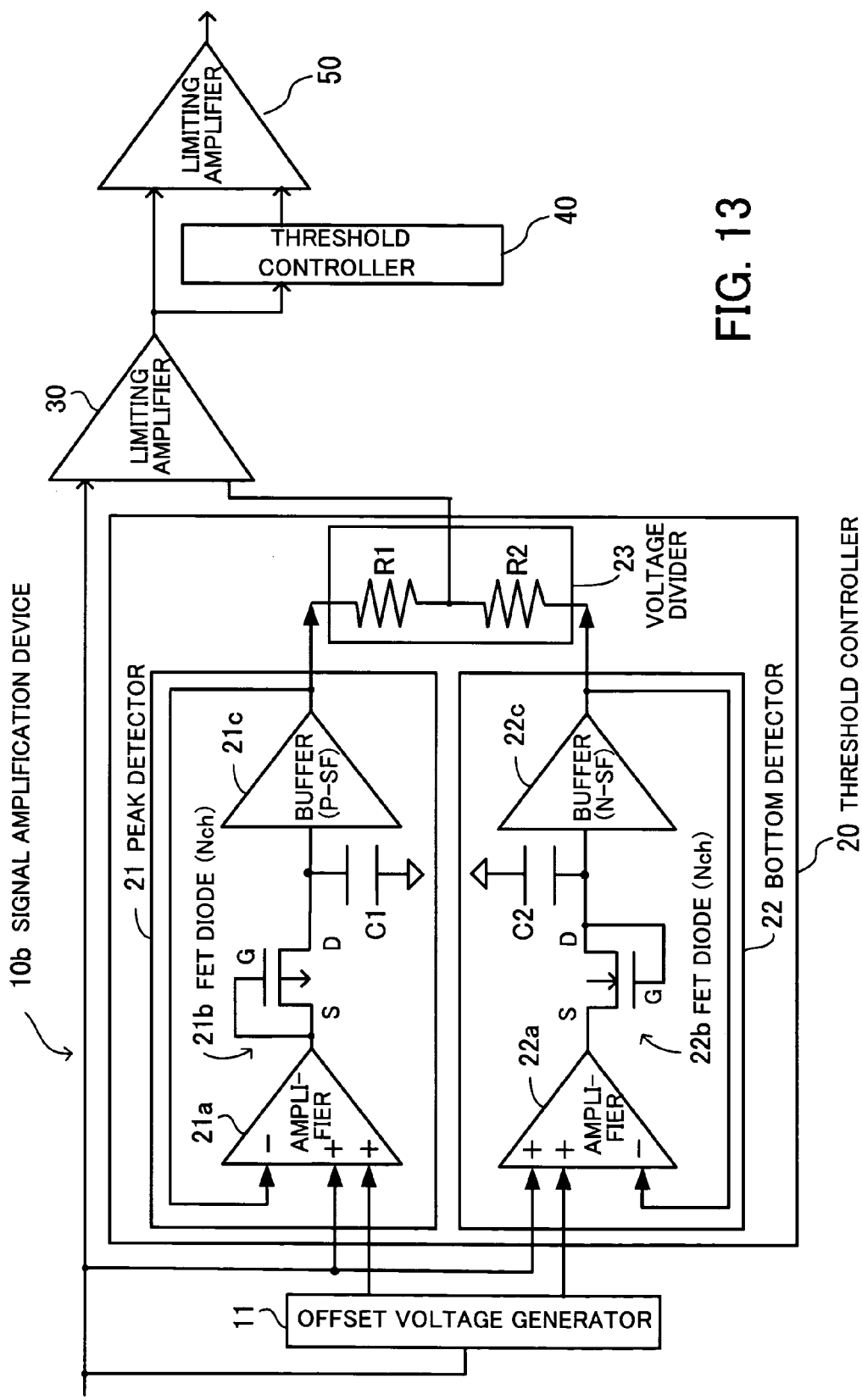
FIG. 13 shows the configuration of a signal amplification device whose bottom detector is of an identical polarity type.

The characteristics of the circuitry can be satisfactorily improved if only the FET diode 21b and the buffer 21c of the peak detector 21 are constituted by elements of the same polarity. Similarly, the characteristics can be satisfactorily improved if only the FET diode 22b and the buffer 22c of the bottom detector 22 are constituted by elements of the same polarity. FIG. 12 shows the configuration of a signal amplification device 10a in which only the peak detector is constituted by elements of the same polarity, and FIG. 13 shows the configuration of a signal amplification device 10b in which only the bottom detector is constituted by elements of the same polarity. Needless to say, the offset voltage generator may be simply applied to the conventional arrangement using a diode and a buffer of different polarities, and also in this case, the advantage of the present invention, that is, the effect of restraining narrowing of the bandwidth, can be attained.

Modifications of the signal amplification device 10 will be now described. In a first modification, the peak detector 21 is configured such that the capacitor C1 is connected at one end to GND, to detect the peak value of the input signal Din by using GND as a reference, while the bottom detector 22 is configured such that the capacitor C2 is supplied at one end with the peak value detected by the peak detector 21, to detect the bottom value of the input signal Din by using the peak value as a reference.

Figure 14:
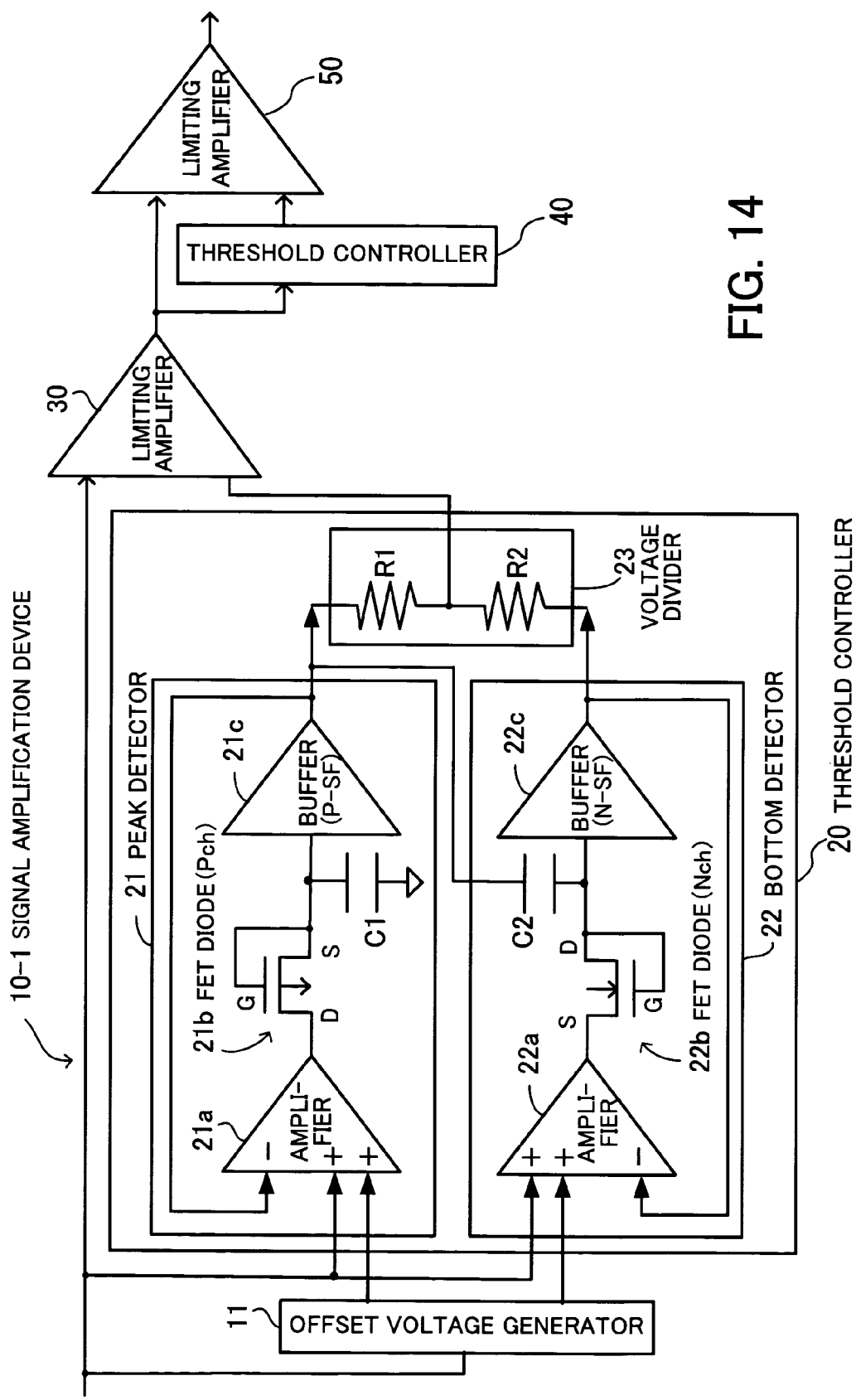
FIG. 14 shows the configuration of a first modification.

FIG. 14 shows the configuration of the first modification. In the signal amplification device 10 shown in FIG. 6, the capacitor C2 is connected at one end to GND, but in the signal amplification device 10-1, the capacitor C2 is connected at one end to the output terminal of the buffer 21c (In other respects, the configuration of the signal amplification device 10-1 is identical with that of the signal amplification device 10 of FIG. 6). With this configuration, the peak detector 21 detects the peak value of the input signal Din by using GND as a reference (absolute value detection), and the bottom detector 22 detects the lowest voltage level (bottom value) of the input signal by using, as a reference, the peak value output from the buffer 21c (amplitude detection).

A second modification will be now described. In the second modification, the bottom detector 22 is configured such that the capacitor C2 is connected at one end to GND, to detect the bottom value of the input signal by using GND as a reference, while the peak detector 21 is configured such that the capacitor C1 is supplied at one end with the bottom value detected by the bottom detector 22, to detect the peak value of the input signal Din by using the bottom value as a reference.

Figure 15:
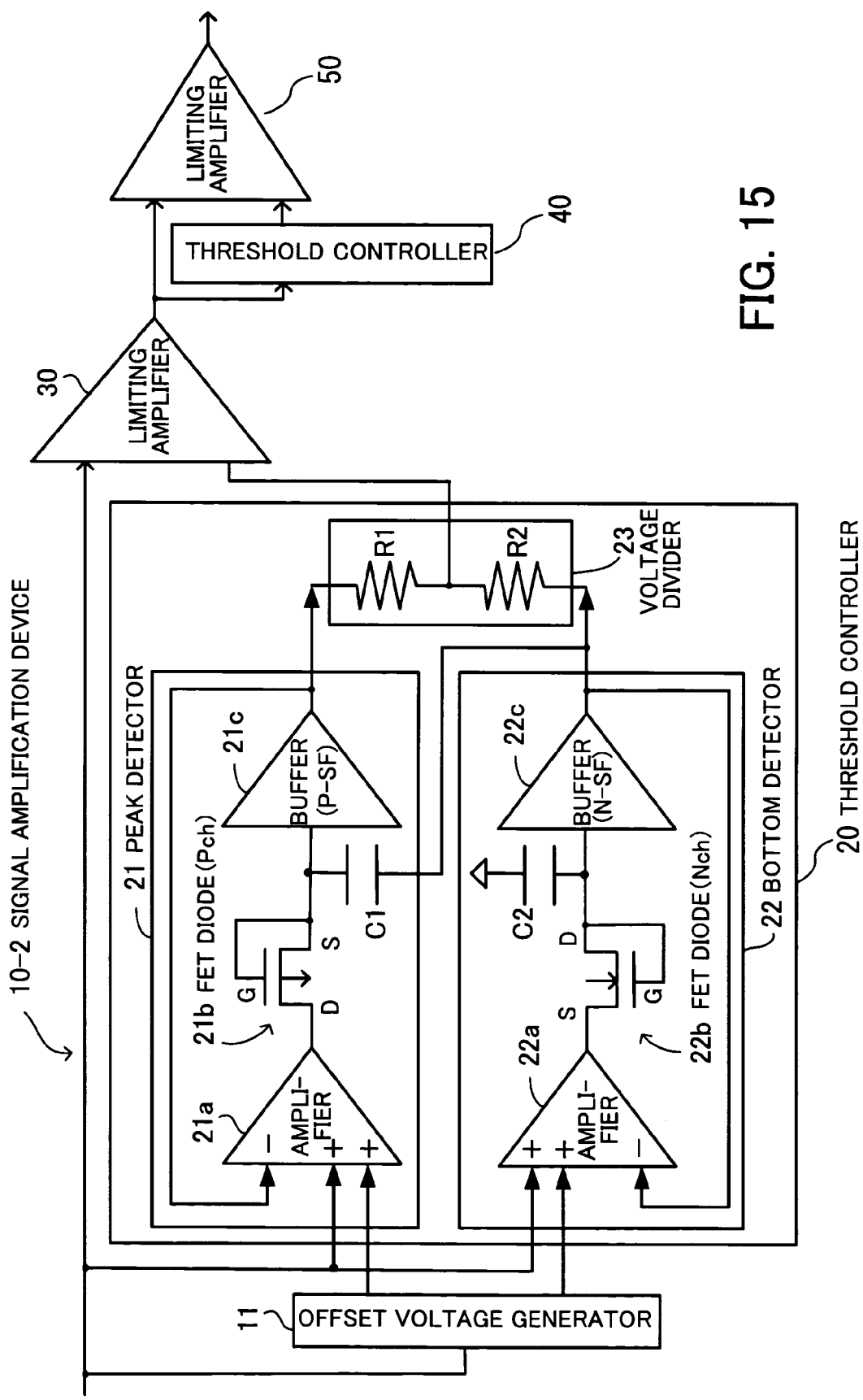
FIG. 15 shows the configuration of a second modification.

FIG. 15 shows the configuration of the second modification. In the signal amplification device 10 shown in FIG. 6, the capacitor C1 is connected at one end to GND; in the signal amplification device 10-2, the capacitor C1 is connected at one end to the output terminal of the buffer 22c (In other respects, the configuration of the signal amplification device 10-2 is identical with that of the signal amplification device 10 of FIG. 6). With this configuration, the bottom detector 22 detects the bottom value of the input signal Din by using GND as a reference (absolute value detection), and the peak detector 21 detects the highest voltage level (peak value) of the input signal by using, as a reference, the bottom value output from the buffer 22c (amplitude detection).

A third modification will be now described. In the third modification, an AGC (Automatic Gain Control) amplifier is used in place of the limiting amplifier 30, and amplification is performed by the AGC amplifier with the gain controlled in accordance with a differential between the peak and bottom values.

Figure 16:
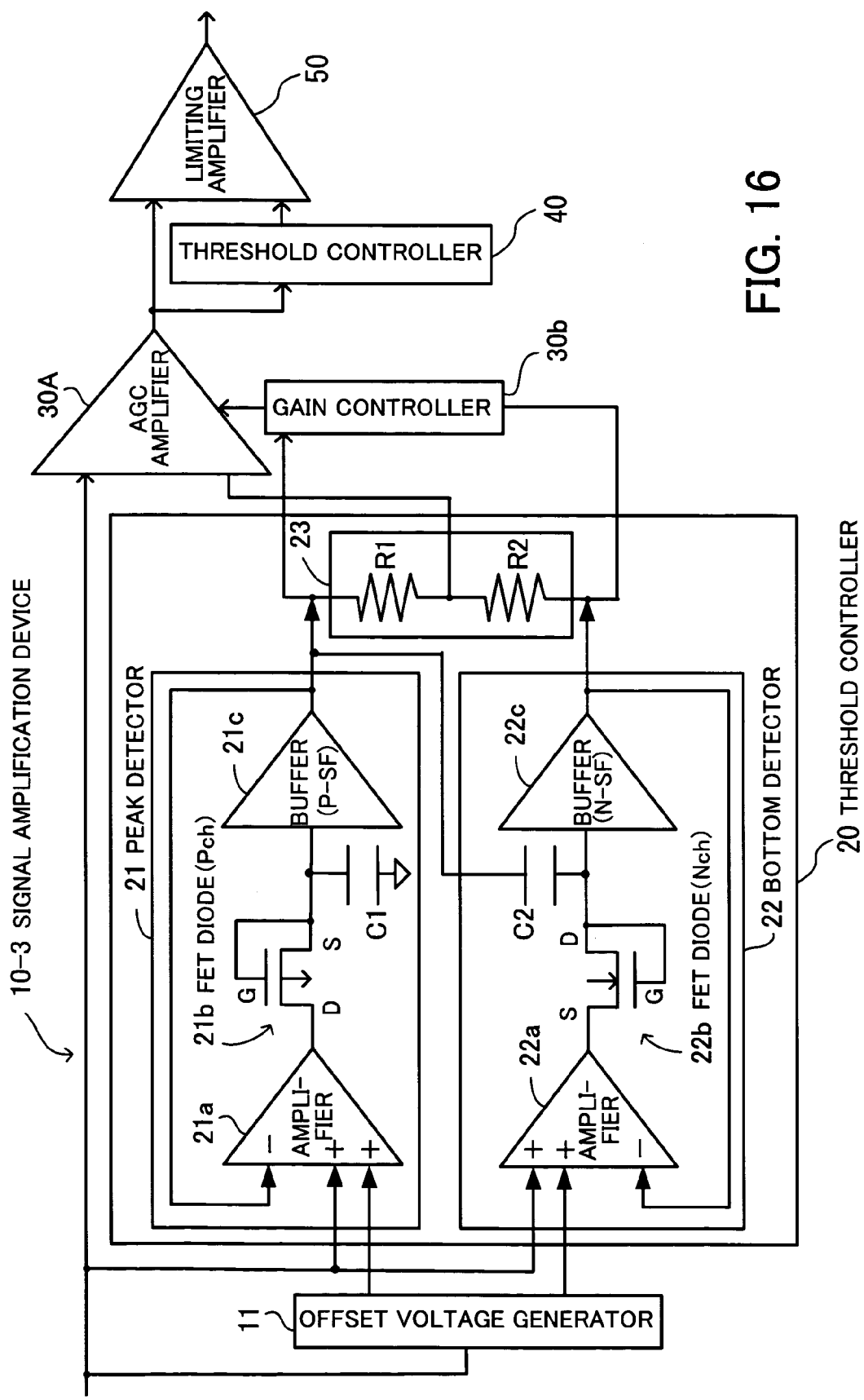
FIG. 16 shows the configuration of a third modification.

FIG. 16 illustrates the configuration of the third modification. A signal amplification device 10-3 according to the third modification is provided with an AGC amplifier 30a and a gain controller 30b. The AGC amplifier 30a has one signal input terminal supplied with the input signal Din, and has the other signal input terminal applied with the threshold level Vth1. The gain controller 30b has one input terminal connected to the output terminal of the buffer 21c, and has the other input terminal connected to the output terminal of the buffer 22c. The output terminal of the gain controller 30b is connected to the control terminal of the AGC amplifier 30a.

If the differential between the peak value output from the peak detector 21 and the bottom value output from the bottom detector 22 exceeds a fixed value, the gain controller 30b decreases the gain of the AGC amplifier 30a (while the differential remains below the fixed value, the gain controller does not change the gain), thereby controlling the output of the AGC amplifier 30a. Where the limiting amplifier 30 is used, the input signal is amplified in a manner such that the input signal with a large amplitude is limited to the limiting voltage as it passes through the amplifier, with the result that the output signal is susceptible to waveform distortion attributable to the offset voltages. With the AGC amplifier 30a and the gain controller 30b, on the other hand, the output can be kept linear through AGC, making it possible to lessen waveform distortion attributable to the offset voltages.

A fourth modification will be now described. In the signal amplification device 10 shown in FIG. 1, the negative offset voltage signal D(−) is applied to the bottom detector 22 by the offset voltage generator 11 so that the bottom detection may be masked while the input signal Din is a small signal varying with a small amplitude on the negative side. This function is, however, not particularly needed in the case where the signal amplification device of the present invention is applied to a signal receiver of a system in which the input signal Din varies only on the positive side. Accordingly, in the fourth modification, the masking function by means of the negative offset voltage applied to the bottom detector 22 is removed, and the voltage divider 23 is provided with the function of adjusting the negative offset voltage.

Figure 17:
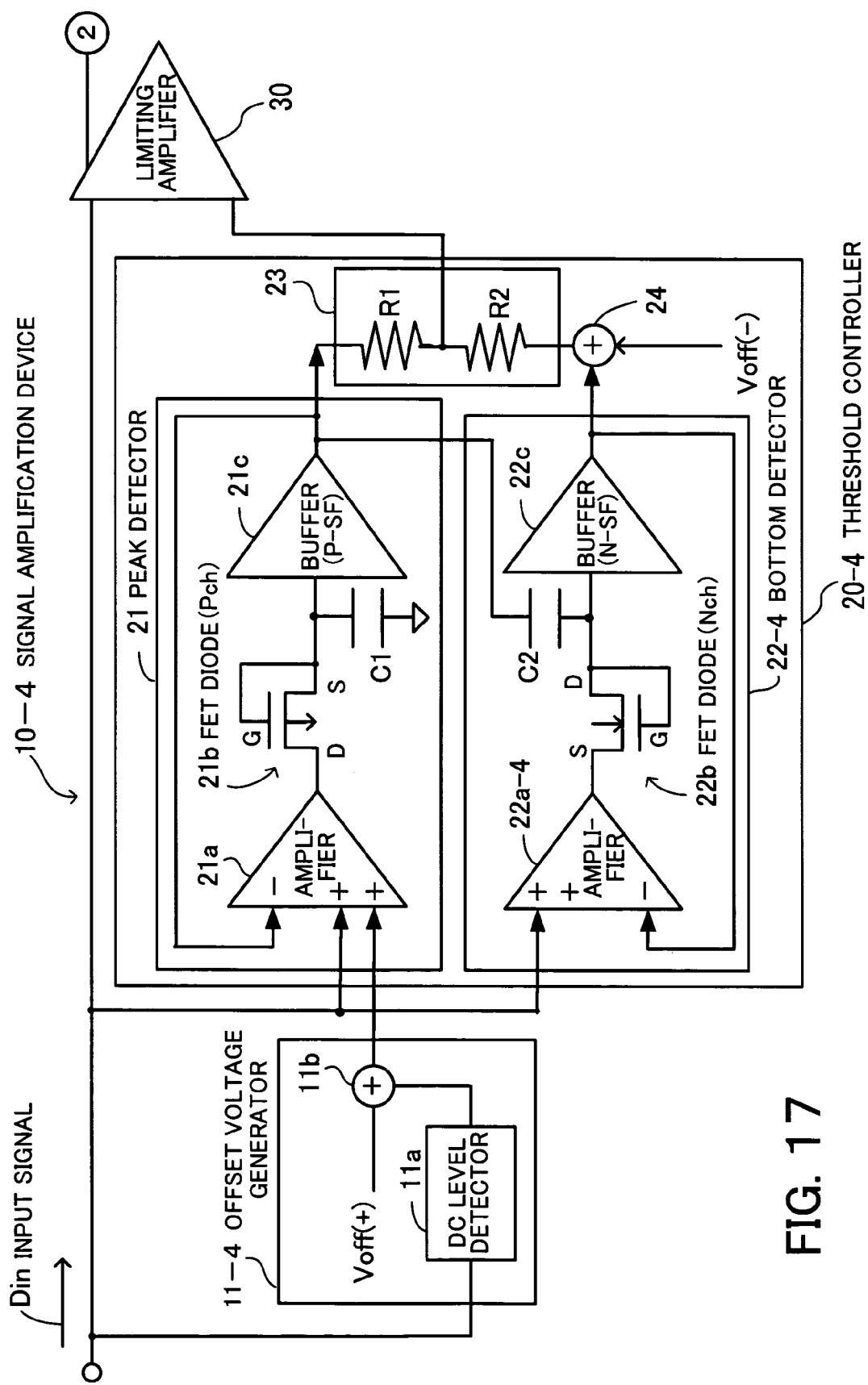
FIG. 17 shows the configuration of a fourth modification.
Figure 18:
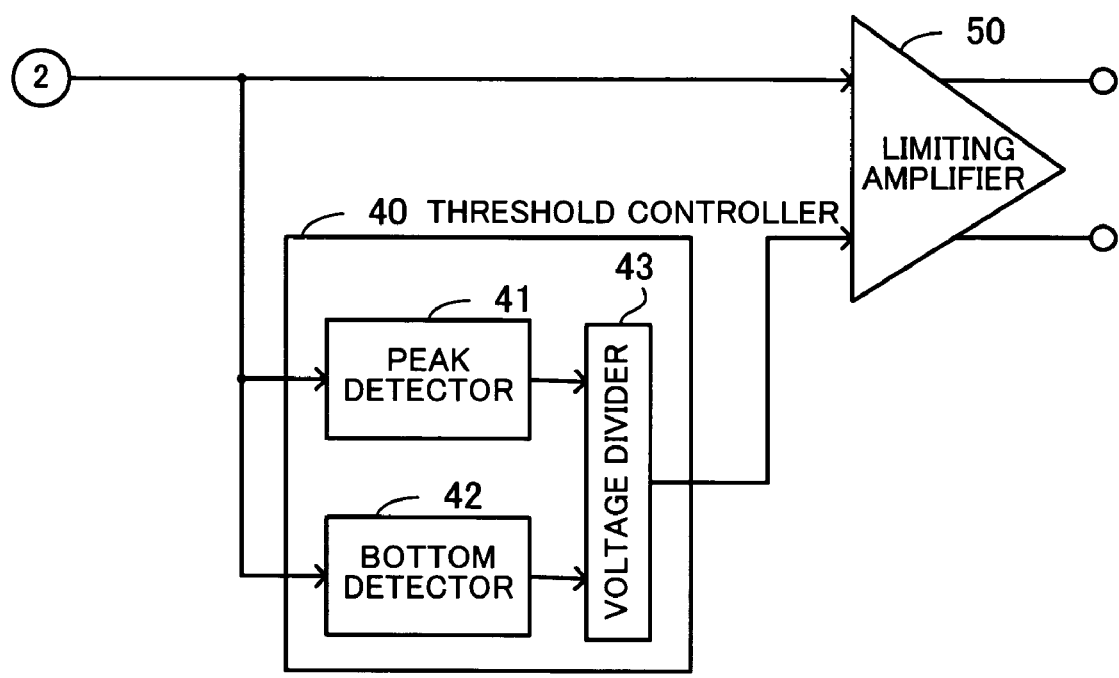
FIG. 18 also shows the configuration of the fourth modification.

FIGS. 17 and 18 illustrate the configuration of the fourth modification. A signal amplification device 10-4 comprises an offset voltage generator 11-4, a threshold controller 20-4, the limiting amplifier 30, the threshold controller 40, and the limiting amplifier 50.

The offset voltage generator 11-4 is constituted by the DC level detector 11a and the adder 11b. The threshold controller 20-4 is constituted by the peak detector 21, a bottom detector 22-4, the voltage divider 23, and a negative offset voltage adder 24.

The peak detector 21 comprises the amplifier 21a, the FET diode 21b, the buffer 21c and the capacitor C1, and the bottom detector 22-4 comprises an amplifier 22a-4, the FET diode 22b, the buffer 22c and the capacitor C2. The voltage divider 23 comprises the resistors R1 and R2.

The threshold controller 40 comprises the peak detector 41, the bottom detector 42, and the voltage divider 43. The threshold controller 40 has a circuit configuration identical with that of the threshold controller 20-4 except that it is not input with the offset voltage signal, and therefore, internal arrangement thereof is not illustrated.

The circuit elements of the offset voltage generator 11-4 and those of the threshold controller 20-4 are connected in the manner described below. In the following, however, description of the peak detector 21 is omitted since the peak detector is configured in the same manner as that shown in FIG. 6. The input signal Din is input to the DC level detector 11a. The adder 11b adds the positive offset voltage Voff(+) and the output of the DC level detector 11a, the result of the addition being input to one input terminal (+) of the amplifier 21a.

The amplifier 22a-4 has an input terminal (−) to which the output of the buffer 22c is fed back, and has the other input terminal (+) supplied with the input signal Din.

The output terminal of the amplifier 22a-4 is connected to the source of the FET diode 22b, of which the drain is connected to the gate, one end of the capacitor C2 and the input terminal of the buffer 22c. The other end of the capacitor C2 is connected to the output terminal of the buffer 21c. The output terminal of the buffer 22c is connected to the input terminal (−) of the amplifier 22a-4 as well as to one input terminal of the negative offset voltage adder 24.

The other input terminal of the negative offset voltage adder 24 is input with the negative offset voltage Voff(−), and the result of the addition is applied to one end of the resistor R2. The other circuit elements are connected in the same manner as explained above with reference to FIG. 6.

Figure 19:
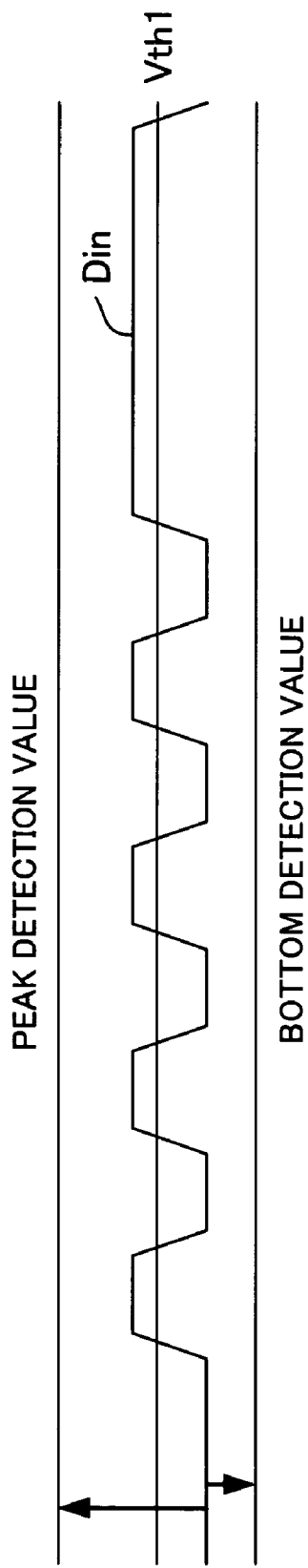
FIG. 19 shows a waveform response where the input signal is a small signal.
Figure 20:
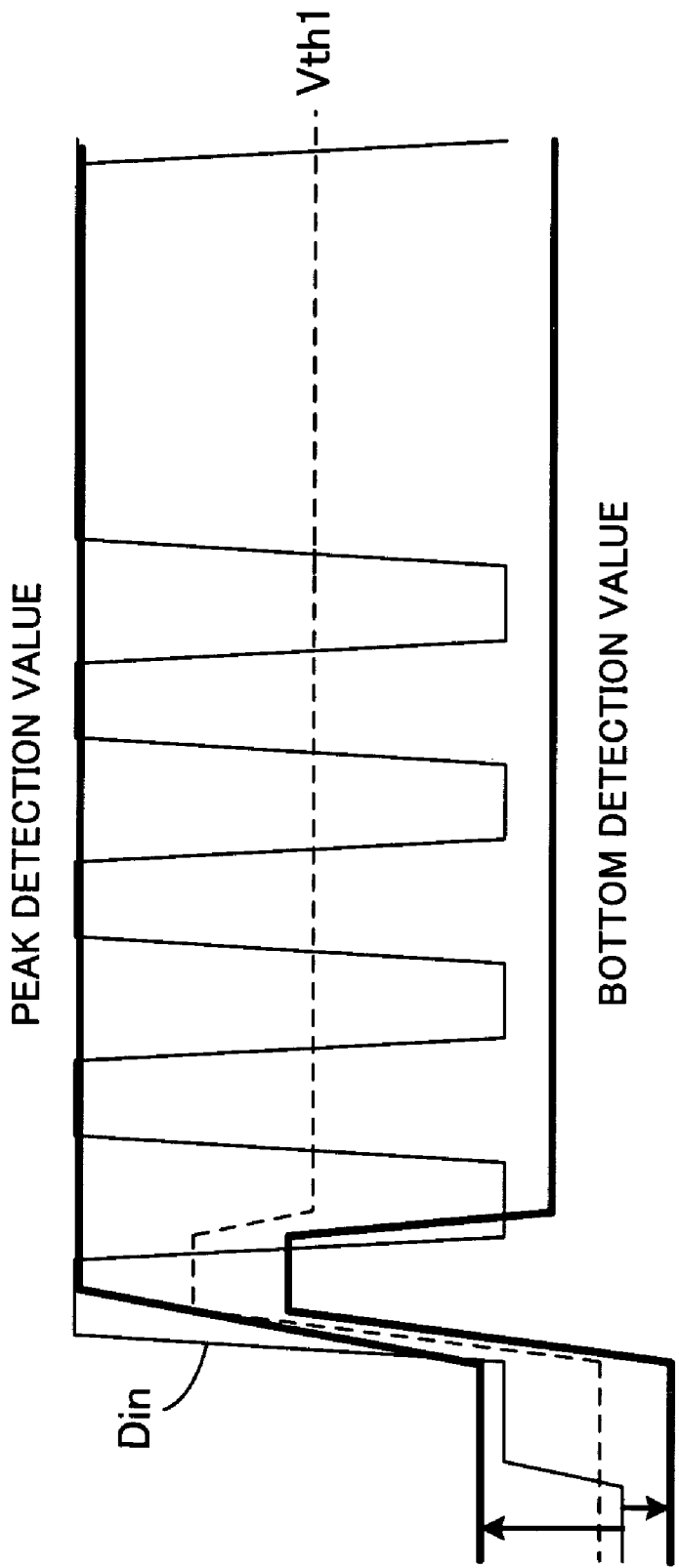
FIG. 20 shows a waveform response where the input signal is a large signal.

In the signal amplification device 10-4 according to the fourth modification, the peak detection is controlled by using, when necessary, the positive offset voltage signal D(+) from the offset voltage generator 11-4, while the bottom detector 22-4 performs normal bottom detection all the time. Further, the capacitor C2 in the bottom detector 22-4 is connected to the output terminal of the buffer 21c, as in the first modification shown in FIG. 14. Consequently, the peak detector 21 detects the peak value of the input signal Din by using GND as a reference (absolute value detection), and the bottom detector 22-4 detects the lowest voltage level (bottom value) of the input signal by using, as a reference, the peak value output from the buffer 21c (amplitude detection). Moreover, the negative offset voltage adder 24 adds the bottom value and the preset negative offset voltage Voff(−) to generate a negative bottom shift value, and the voltage divider 23 divides the potential difference between the peak value and the negative bottom shift value output from the negative offset voltage adder 24, to generate the threshold level Vth1. FIG. 19 shows a waveform response of the signal amplification device 10-4 where the input signal Din is a small signal, and FIG. 20 shows a waveform response of the same device where the input signal Din is a large signal.

The following describes the case where the signal amplification device 10-4 shown in FIGS. 17 and 18 is applied, by way of example, to an optical access system such as G-PON.

Figure 21:
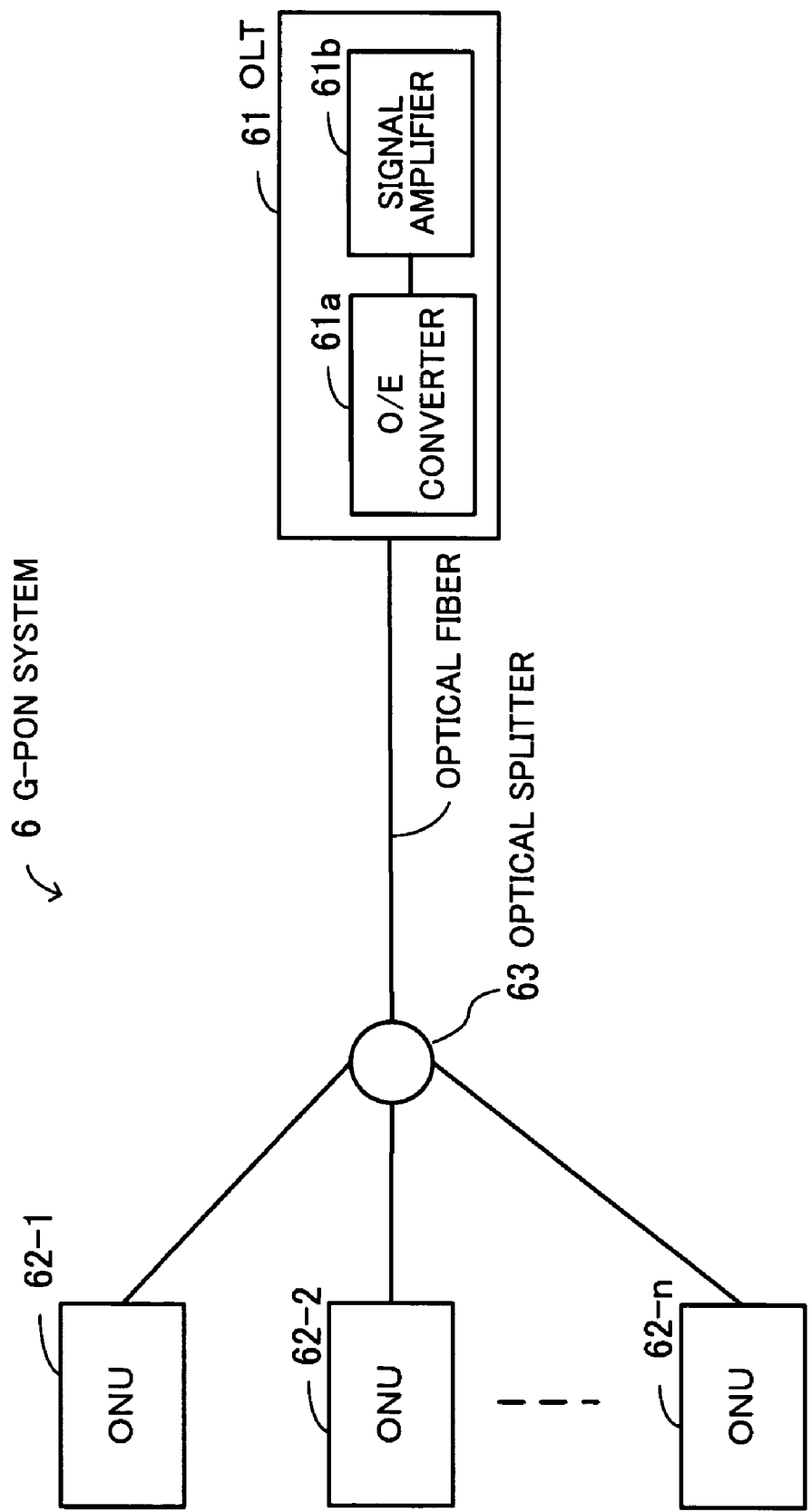
FIG. 21 shows a G-PON system to which the signal amplification device is applied.
Figure 22:
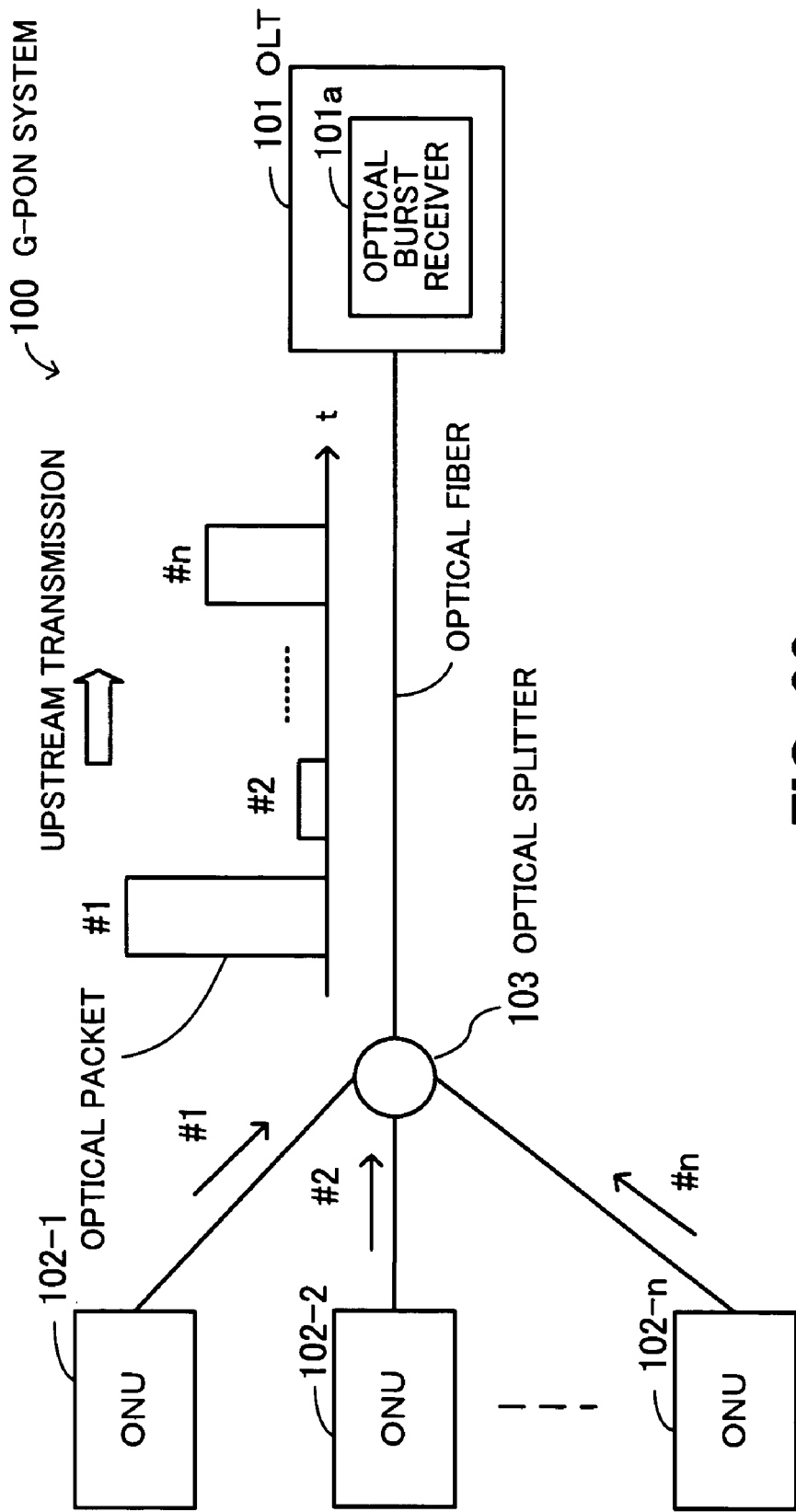
FIG. 22 shows a schematic configuration of a G-PON system.
Figure 23:
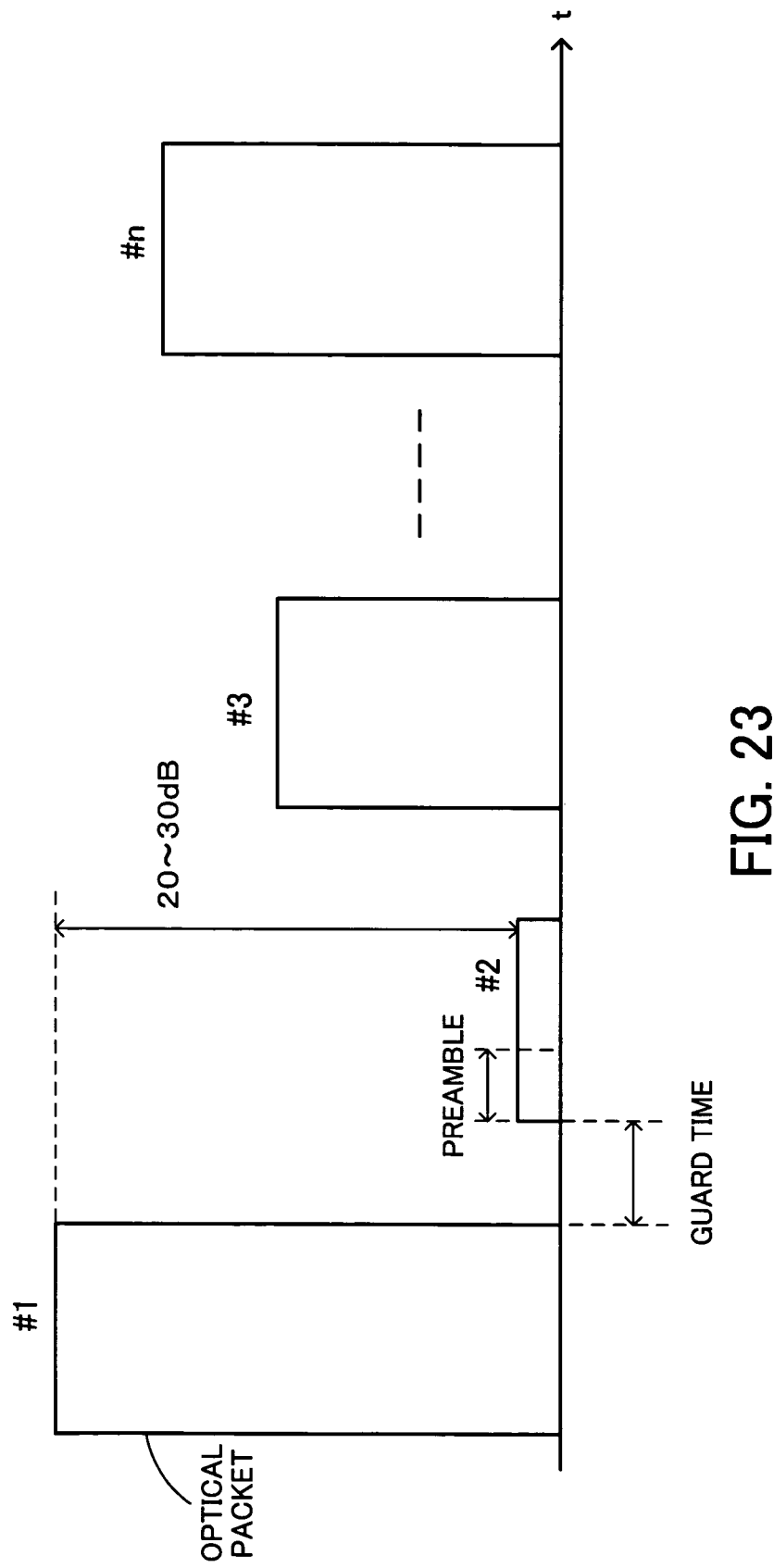
FIG. 23 shows the transmission format of upstream optical packets.
Figure 24:
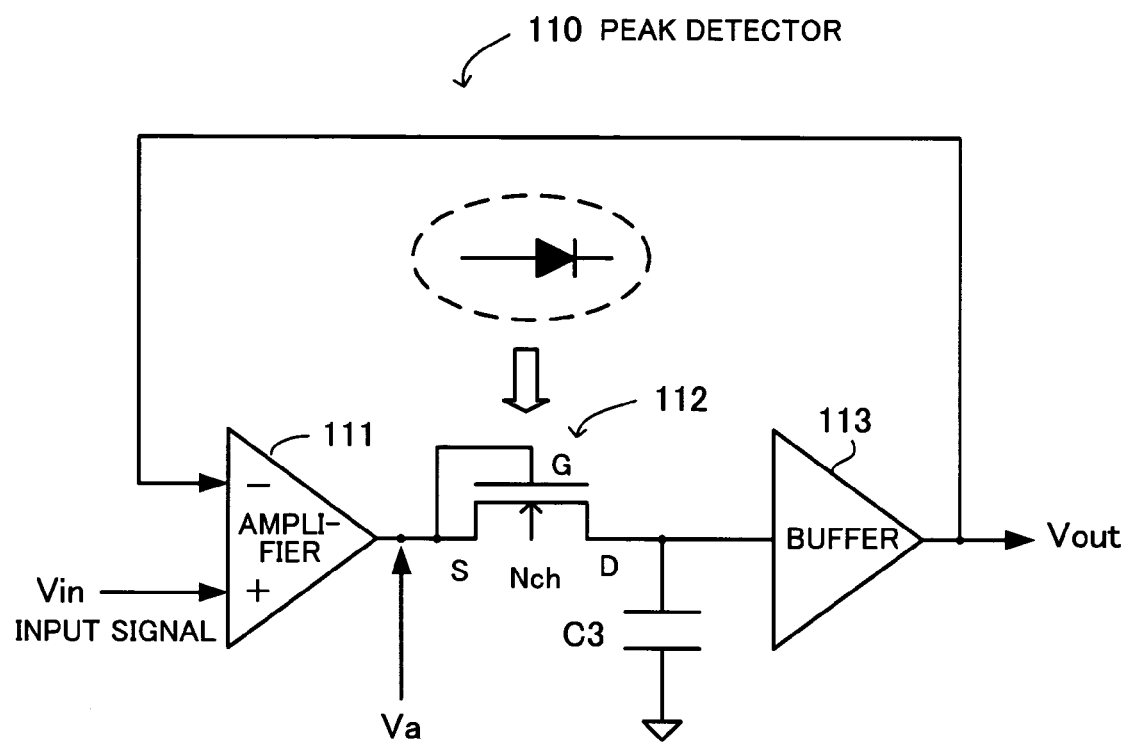
FIG. 24 shows a schematic configuration of a peak detector.
Figure 25:
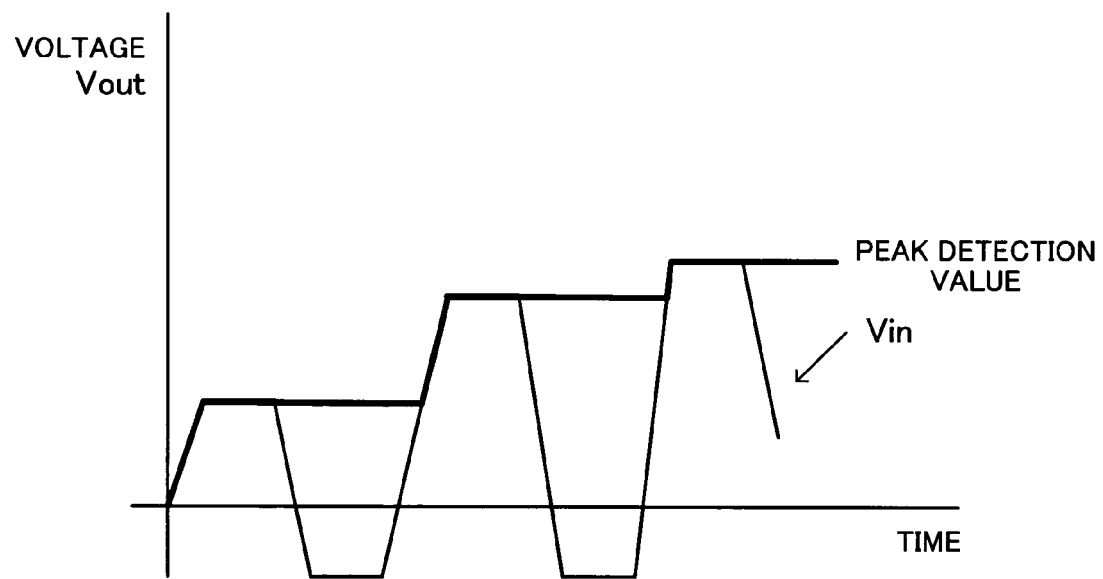
FIG. 25 shows an ideal output waveform of the peak detector.
Figure 26:
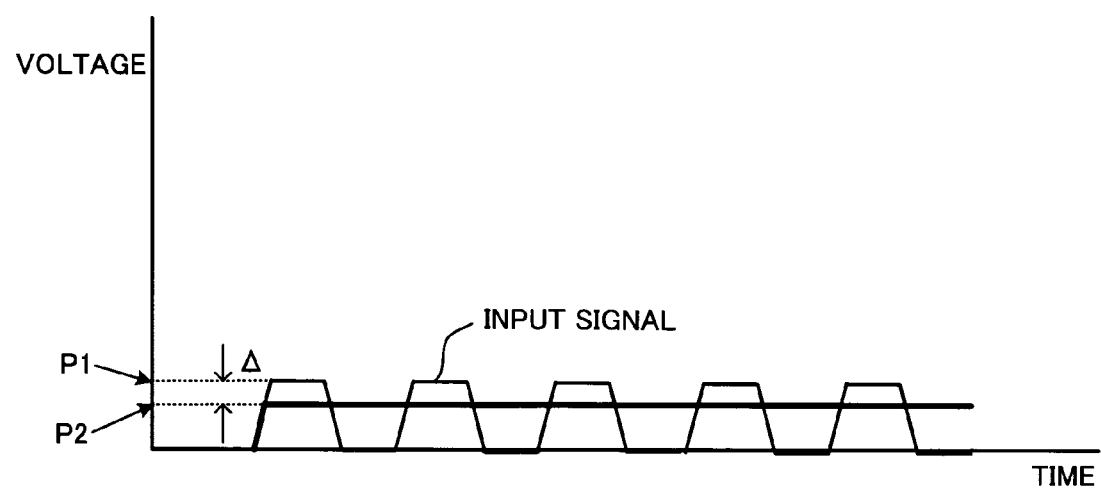
FIG. 26 illustrates peak detection error.
Figure 27:
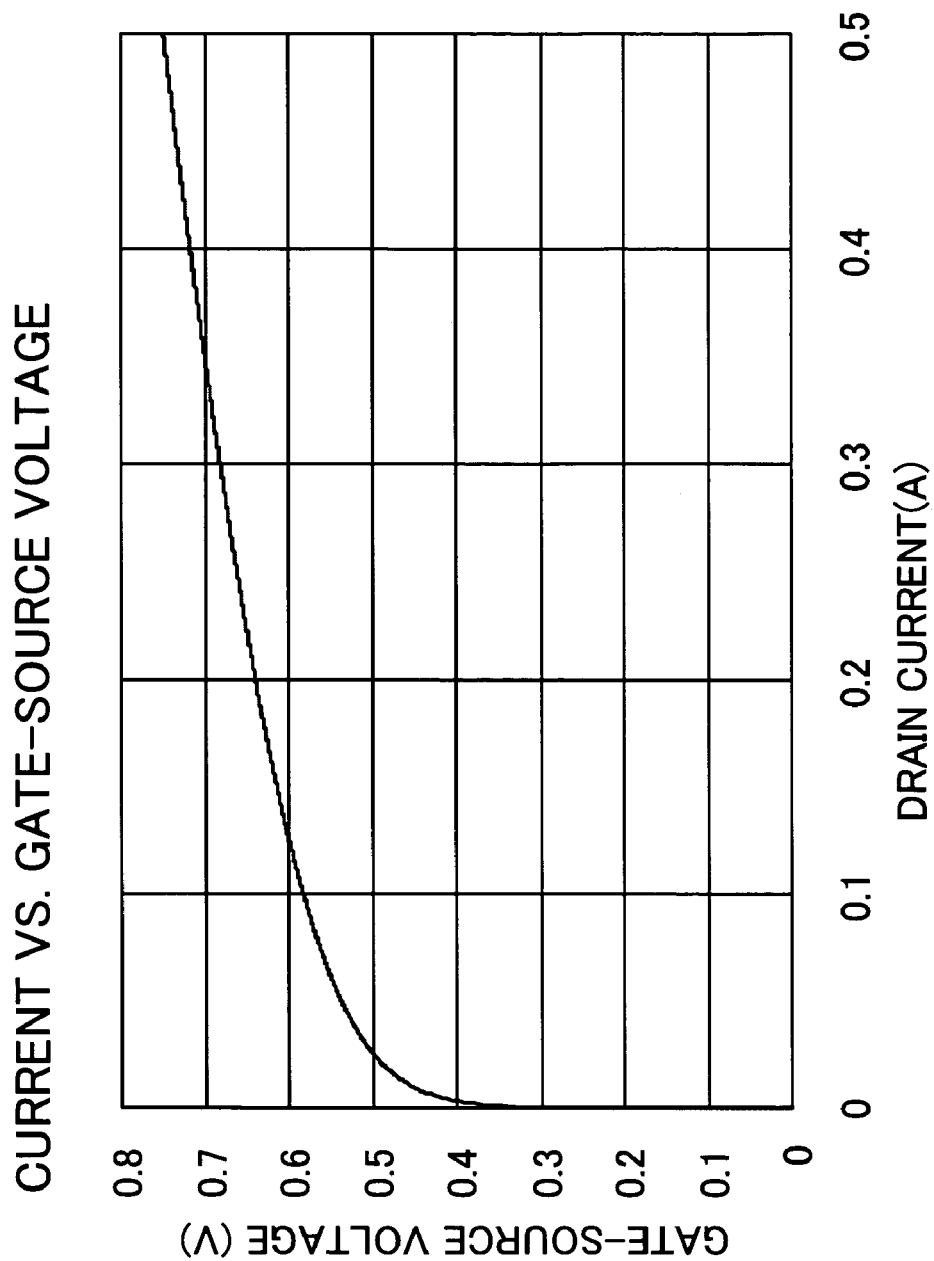
FIG. 27 exemplifies the relationship between drain current and gate-source voltage.
Figure 28:
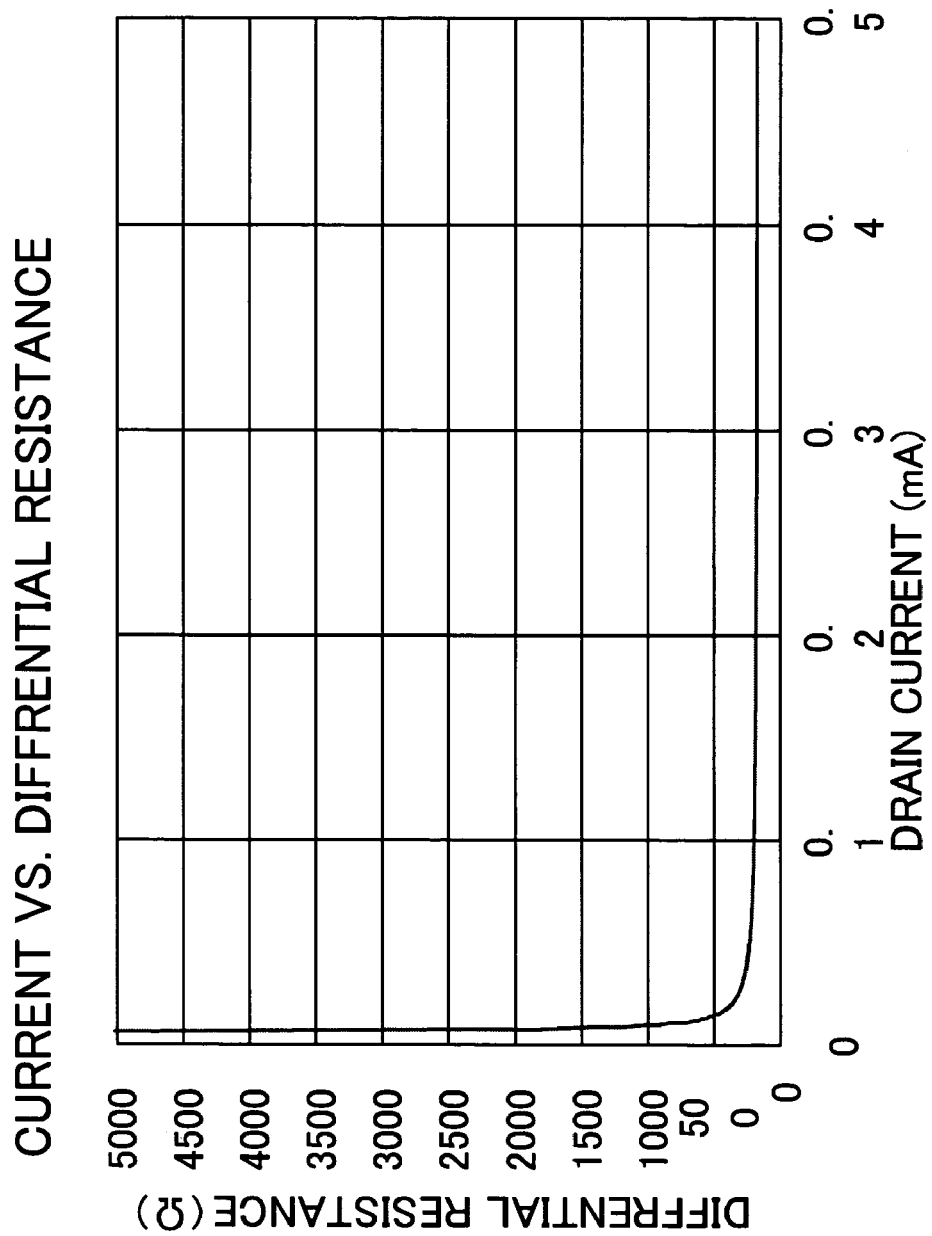
FIG. 28 exemplifies the relationship between drain current and differential resistance.
Figure 29:
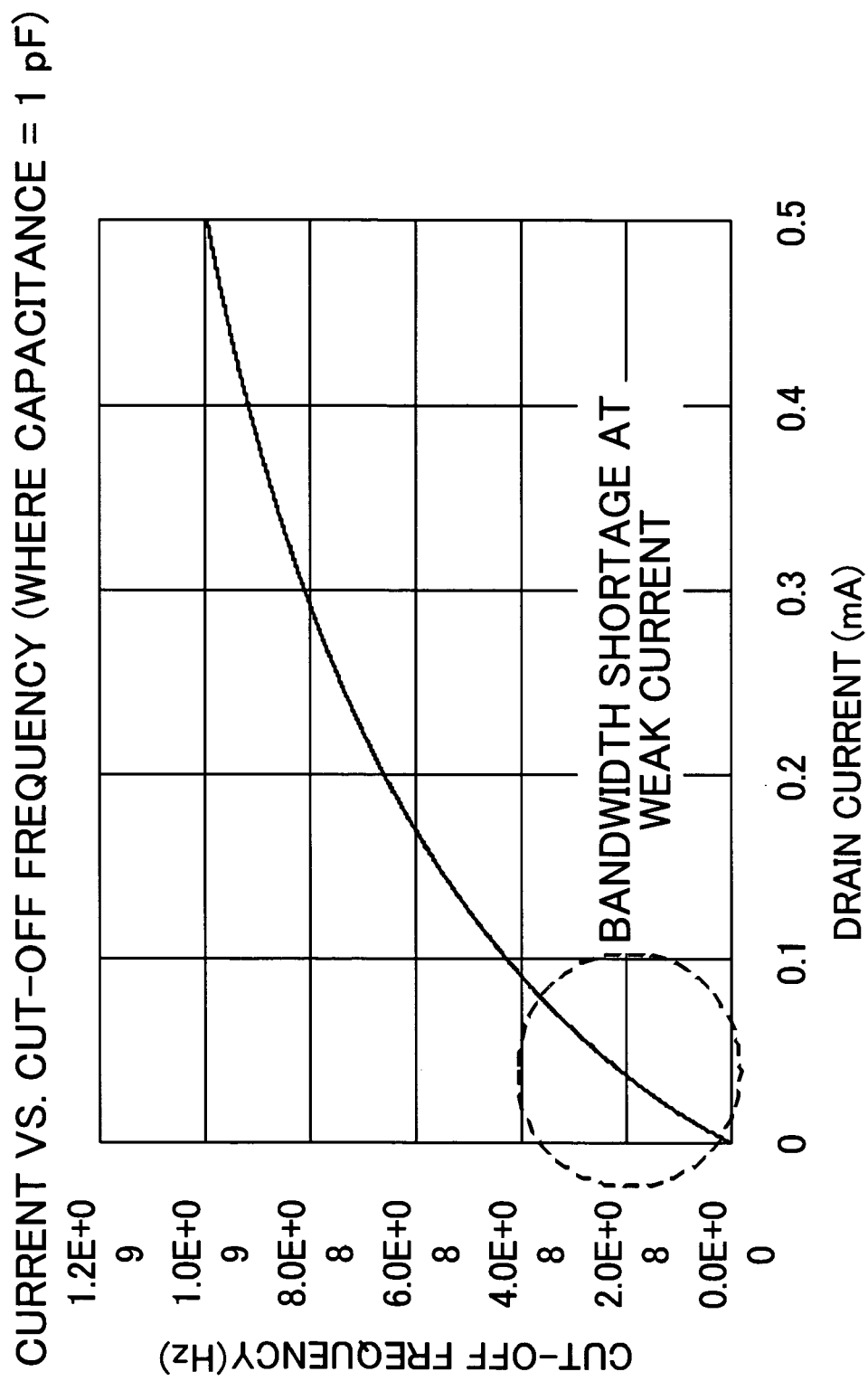
FIG. 29 shows the relationship between drain current and cut-off frequency.
Figure 30:
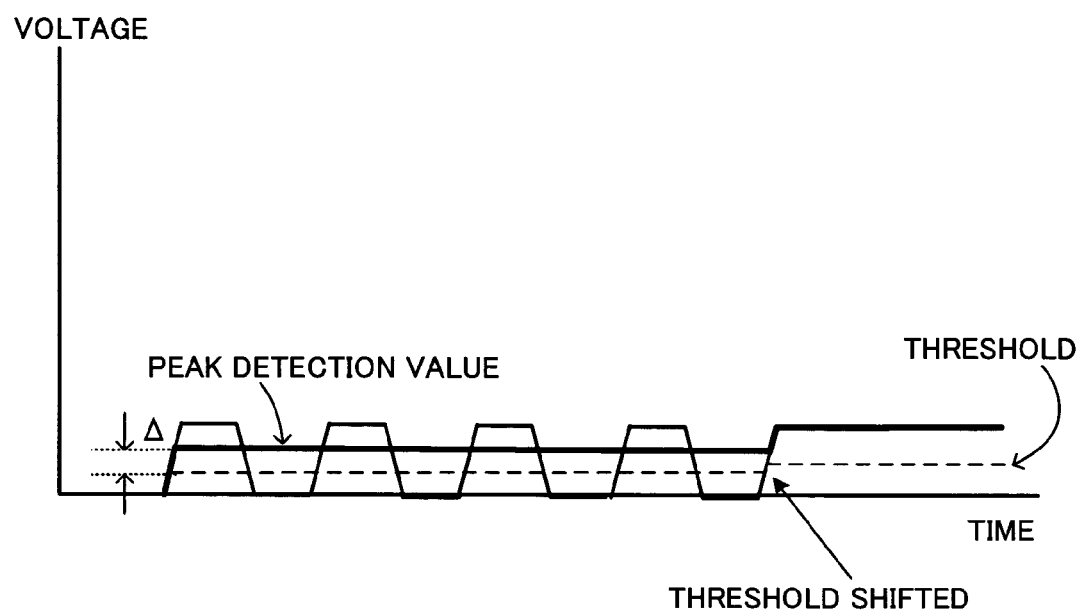
FIG. 30 shows a threshold variation caused at the transition from an alternating waveform to a continuously high waveform.

FIG. 21 shows a G-PON system to which the signal amplification device 10-4 is applied. The G-PON system 6 comprises an OLT 61, a plurality of ONUs 62-1 to 62-n, and an optical splitter 63.

The optical splitter 63 is connected to the ONUs 62-1 to 62-n by as many optical fibers, and is also connected to the OLT 61 by a single optical fiber. The optical splitter multiplexes upstream signals from the ONUs 62-1 to 62-n to be transmitted to the OLT 61, and delivers a downstream signal from the OLT 61 to the ONUs 62-1 to 62-n.

The OLT 61 includes an O/E converter 61a and a signal amplifier 61b. The O/E converter 61a converts optical packets, transmitted from the ONUs 62-1 to 62-n, to an electrical signal. The signal amplifier 61b corresponds to the signal amplification device 10-4 and amplifies the electrical signal output from the O/E converter 61a in accordance with the aforementioned control action. By applying the signal amplification device 10-4 of the present invention to an optical receiver of an OLT in a G-PON system, it is possible to improve the response performance of the 1.25-Gb/s OLT, as well as to configure a simple and cost-effective optical access network by using inexpensive standard CMOS.

The signal amplification device of the present invention includes an offset voltage generator for detecting the direct-current level of an input signal and adding a preset positive offset voltage to the direct-current level to generate a positive offset voltage signal. If the level of the positive offset voltage signal is higher than the maximum level of the input signal, the level of the positive offset voltage signal is output as a peak value, and if the maximum level of the input signal is higher than the level of the positive offset voltage signal, the maximum level of the input signal is output as the peak value, thereby performing peak detection. The peak and bottom values are then subjected to voltage division, to set a threshold level. Thus, in cases where the input signal is such a small signal that quick response thereto is impossible, the threshold level is set using the fixed offset voltage, and only while the input signal is such a large signal that quick response thereto is possible, the peak and the bottom are normally detected, whereby substantial bandwidth can be widened and the threshold level can be set with high accuracy by using inexpensive standard CMOS, without the need to use expensive high-speed IC.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A signal amplification device for amplifying an input signal by automatically setting a threshold level, comprising:

an offset voltage generator for detecting a direct-current level of the input signal, and generating and outputting a positive offset voltage signal or a negative offset voltage signal;

a threshold controller including a peak detector for outputting the positive offset voltage signal as a peak value when a level of the positive offset voltage signal is higher than a maximum level of the input signal, and outputting the maximum level of the input signal as the peak value when the maximum level of the input signal is higher than the level of the positive offset voltage signal, a bottom detector for outputting the negative offset voltage signal as a bottom value when a level of the negative offset voltage signal is lower than a minimum level of the input signal, and outputting the minimum level of the input signal as the bottom value when the minimum level of the input signal is lower than the level of the negative offset voltage signal, and a voltage divider for subjecting the peak value output from the peak detector and the bottom value output from the bottom detector to voltage division, to generate the threshold level; and an amplifier for amplifying a differential between the input signal and the threshold level output from the voltage divider.

2. The signal amplification device according to claim 1, wherein the peak detector includes a peak-side differential amplifier input with the positive offset voltage signal and the input signal, a peak-side diode for rectifying output of the peak-side differential amplifier, a peak-side capacitor for holding a peak voltage, and a peak-side buffer for buffering the peak value, and the bottom detector includes a bottom-side differential amplifier input with the negative offset voltage signal and the input signal, a bottom-side diode for rectifying output of the bottom-side differential amplifier, a bottom-side capacitor for holding a bottom voltage, and a bottom-side buffer for buffering the bottom value.

3. The signal amplification device according to claim 2, wherein the peak-side buffer is a P-channel source follower, and the peak-side diode is a P-channel Metal Oxide Semiconductor-Field Effect Transistor (MOS-FET).

4. The signal amplification device according to claim 2, wherein the bottom-side buffer is an N-channel source follower, and the bottom-side diode is an N-channel MOS-FET.

5. The signal amplification device according to claim 2, wherein the offset voltage generator detects the direct-current level of the input signal and adds a preset positive offset to the direct-current level to set the positive offset voltage signal.

6. The signal amplification device according to claim 2, wherein the offset voltage generator detects the direct-current level of the input signal and adds a preset negative offset to the direct-current level to set the negative offset voltage signal.

7. The signal amplification device according to claim 2, wherein the peak-side capacitor of the peak detector is grounded at one end, and the bottom-side capacitor of the bottom detector is supplied at one end with the output of the peak detector.

8. The signal amplification device according to claim 2, wherein the bottom-side capacitor of the bottom detector is grounded at one end, and the peak-side capacitor of the peak detector is supplied at one end with the output of the bottom detector.

9. The signal amplification device according to claim 1, wherein the amplifier is an automatic gain control amplifier, and the signal amplification device further comprises a gain controller for controlling gain of the automatic gain control amplifier in accordance with a known relationship based on a differential between the peak value output from the peak detector and the bottom value output from the bottom detector.

10. A signal amplification device for amplifying an input signal by automatically setting a threshold level, comprising:

an offset voltage generator for detecting a direct-current level of the input signal that varies on a positive side, and generating and outputting a positive offset voltage signal;

a threshold controller including a peak detector for outputting the positive offset voltage signal as a peak value when a level of the positive offset voltage signal is higher than a maximum level of the input signal, and outputting the maximum level of the input signal as the peak value when the maximum level of the input signal is higher than the level of the positive offset voltage signal, a bottom detector for outputting a minimum level of the input signal as a bottom value, a negative offset voltage adder for adding a preset negative offset to the bottom value to generate a negative bottom shift value, and a voltage divider for subjecting the peak value output from the peak detector and the negative bottom shift value output from the negative offset voltage adder to voltage division, to generate the threshold level; and an amplifier for amplifying a differential between the input signal and the threshold level output from the voltage divider.

11. A signal amplification device for amplifying an input signal by automatically setting a threshold level, comprising:

an offset voltage generator for detecting a direct-current level of the input signal that varies on a negative side, and generating and outputting a negative offset voltage signal;

a threshold controller including a bottom detector for outputting the negative offset voltage signal as a bottom value when a level of the negative offset voltage signal is lower than a minimum level of the input signal, and outputting the minimum level of the input signal as the bottom value when the minimum level of the input signal is lower than the level of the negative offset voltage signal, a peak detector for outputting a maximum level of the input signal as a peak value, a positive offset voltage adder for adding a preset positive offset to the peak value to generate a positive peak shift value, and a voltage divider for subjecting the bottom value output from the bottom detector and the positive peak shift value output from the positive offset voltage adder to voltage division, to generate the threshold level; and an amplifier for amplifying a differential between the input signal and the threshold level output from the voltage divider.

12. The signal amplification device according to claim 10, wherein the peak detector includes a peak-side differential amplifier input with the positive offset voltage signal and the input signal, a peak-side diode for rectifying output of the peak-side differential amplifier, a peak-side capacitor for holding a peak voltage, and a peak-side buffer for buffering the peak value.

13. The signal amplification device according to claim 11, wherein the bottom detector includes a bottom-side differential amplifier input with the negative offset voltage signal and the input signal, a bottom-side diode for rectifying output of the bottom-side differential amplifier, a bottom-side capacitor for holding a bottom voltage, and a bottom-side buffer for buffering the bottom value.

14. The signal amplification device according to claim 12, wherein the peak-side buffer is a P-channel source follower, and the peak-side diode is a P-channel MOS-FET.

15. The signal amplification device according to claim 13, wherein the bottom-side buffer is an N-channel source follower, and the bottom-side diode is an N-channel MOS-FET.

16. The signal amplification device according to claim 12, wherein the offset voltage generator detects the direct-current level of the input signal and adds a preset positive offset to the direct-current level to set the positive offset voltage signal.

17. The signal amplification device according to claim 13, wherein the offset voltage generator detects the direct-current level of the input signal and adds a preset negative offset to the direct-current level to set the negative offset voltage signal.

18. The signal amplification device according to claim 12, wherein the peak-side capacitor of the peak detector is grounded at one end, and the bottom-side capacitor of the bottom detector is supplied at one end with the output of the peak detector.

19. The signal amplification device according to claim 13, wherein the bottom-side capacitor of the bottom detector is grounded at one end, and the peak-side capacitor of the peak detector is supplied at one end with the output of the bottom detector.

20. The signal amplification device according to claim 1, wherein the amplifier is an automatic gain control amplifier, and the signal amplification device further comprises a gain controller for controlling gain of the automatic gain control amplifier in accordance with a known relationship based on a differential between the peak value output from the peak detector and the bottom value output from the bottom detector.

21. A signal amplification device comprising:

a first signal amplifier constituted by the signal amplification device according to claim 1;

a second threshold controller including a second peak detector for detecting a peak value of an amplified signal amplified by the first signal amplifier, a second bottom detector for detecting a bottom value of the amplified signal, and a second voltage divider for subjecting the peak value output from the second peak detector and the bottom value output from the second bottom detector to voltage division, to generate a second threshold level; and a second amplifier for amplifying a differential between the amplified signal and the second threshold level output from the second voltage divider.

* * * * *